United States Patent [19]
Mayers et al.

[11] Patent Number: 5,532,694
[45] Date of Patent: Jul. 2, 1996

[54] DATA COMPRESSION APPARATUS AND METHOD USING MATCHING STRING SEARCHING AND HUFFMAN ENCODING

[75] Inventors: Clay Mayers, San Diego; Douglas L. Whiting, Carlsbad, both of Calif.

[73] Assignee: Stac Electronics, Inc., San Diego, Calif.

[21] Appl. No.: 499,230

[22] Filed: Jul. 7, 1995

Related U.S. Application Data

[63] Continuation of Ser. No. 927,343, Aug. 10, 1992, abandoned, which is a continuation-in-part of Ser. No. 870,554, Apr. 17, 1992, abandoned, which is a continuation of Ser. No. 619,291, Nov. 27, 1990, Pat. No. 5,146,221, which is a division of Ser. No. 297,152, Jan. 13, 1989, Pat. No. 5,016,009.

[51] Int. Cl.[6] .................................................. H03M 7/40
[52] U.S. Cl. .................................................. 341/67
[58] Field of Search .................................. 341/50, 51, 67, 341/106

[56] References Cited

U.S. PATENT DOCUMENTS

| | | |
|---|---|---|
| 3,054,987 | 9/1962 | Lawrence et al. . |
| 3,344,406 | 9/1967 | Vinal . |
| 3,390,380 | 6/1968 | Cooke-Yarborough et al. . |
| 3,394,352 | 7/1968 | Wernikoff et al. . |
| 3,396,352 | 8/1968 | Wilson . |
| 3,612,660 | 10/1971 | Miller . |
| 3,675,211 | 7/1972 | Raviv . |
| 3,675,212 | 7/1972 | Raviv et al. . |
| 3,726,993 | 4/1973 | Lavallee . |
| 3,767,901 | 10/1973 | Black et al. . |
| 3,873,977 | 3/1975 | McIntosh . |
| 3,970,183 | 7/1976 | Robinson et al. . |
| 3,976,844 | 8/1976 | Betz . |
| 3,995,254 | 11/1976 | Rosenbaum . |
| 4,021,782 | 5/1977 | Hoerning . |
| 4,031,515 | 6/1977 | Kashio . |

(List continued on next page.)

FOREIGN PATENT DOCUMENTS

| | | |
|---|---|---|
| 2625527 | 3/1978 | Germany . |
| 57-132242 | 8/1982 | Japan . |

OTHER PUBLICATIONS

Bar–Ness et al. "String Dictionary Structure for Markov Arithmetic Encoding," IEEE International Conference on Communications, vol. 1, Jun. 1988, New York, pp. 395–399.
English translation of German Patent No. 26 25 527, 1978.
Berkovich, S. et al., "Matching String Patterns in Large Textual Files," Department of Electrical Engineering and Computer Science, George Washington Univ., pp. 122–127, 1985.
Boyer, R., "A Fast String Searching Algorithm", Communications of the ACM 20(10), 762–772, 1977.
Cleary, J., "Compact Hash Tables Using Bidirectional Linear Probing"; IEEE Transactions on Computers c–33(9): 828–834, 1984.
Collmeyer, A. et al., "Analysis of Retrieval Performance for Selected File Organization Techniques," Proc. Fall Joint Comp. Conf., pp. 201–210, 1970.
Comer, D., "English Dictionary Searching with Little Extra Space," National Computer Conference, pp. 209–216, 1979.

(List continued on next page.)

Primary Examiner—Brian K. Young
Attorney, Agent, or Firm—Irell & Manella

[57] ABSTRACT

An apparatus and method for converting an input data character stream into a variable length encoded data stream in a data compression system. A sliding window data compression algorithm is combined with Huffman encoding on the strings and raw bytes. The Huffman table, in a compressed form, is prepended to the encoded output data. The Huffman codes representing the shortest strings encode both the string length and part of the string offset. Assigning Huffman codes to represent the combined length and offset allows the use of a smaller sliding window size without sacrificing compression ratio. The smaller window size allows implementations in software and hardware to minimize memory usage, thus reducing cost.

26 Claims, 17 Drawing Sheets

U.S. PATENT DOCUMENTS

| | | |
|---|---|---|
| 4,034,350 | 7/1977 | Kashio . |
| 4,054,951 | 10/1977 | Jackson et al. . |
| 4,064,489 | 12/1977 | Babb . |
| 4,121,259 | 10/1978 | Preuss et al. . |
| 4,135,214 | 1/1979 | Weber . |
| 4,145,686 | 3/1979 | McMurray et al. . |
| 4,207,599 | 6/1980 | Murayama et al. . |
| 4,232,375 | 11/1980 | Paugstat et al. . |
| 4,290,105 | 9/1981 | Cichelli et al. . |
| 4,295,124 | 10/1981 | Roybal . |
| 4,319,225 | 3/1982 | Klose . |
| 4,376,933 | 3/1983 | Saran et al. . |
| 4,382,286 | 5/1983 | Mitchell et al. . |
| 4,386,416 | 5/1983 | Giltner et al. . |
| 4,412,306 | 10/1983 | Moll . |
| 4,464,650 | 8/1984 | Eastman et al. . |
| 4,486,853 | 12/1984 | Parsons . |
| 4,491,934 | 1/1985 | Heinz . |
| 4,494,150 | 1/1985 | Brickman et al. . |
| 4,494,151 | 1/1985 | Liao . |
| 4,506,325 | 3/1985 | Bennett et al. . |
| 4,507,752 | 3/1985 | McKenna et al. . |
| 4,516,246 | 5/1985 | Kenemuth . |
| 4,543,612 | 9/1985 | Matsunaga et al. . |
| 4,545,032 | 10/1985 | Mak . |
| 4,546,342 | 10/1985 | Weaver et al. . |
| 4,558,302 | 12/1985 | Welch . |
| 4,597,057 | 6/1986 | Snow . |
| 4,610,027 | 9/1986 | Anderson et al. . |
| 4,612,532 | 9/1986 | Bacon et al. . |
| 4,626,824 | 12/1986 | Larson . |
| 4,626,829 | 12/1986 | Hauck . |
| 4,684,923 | 8/1987 | Koga . |
| 4,701,108 | 10/1987 | Scampini . |
| 4,701,745 | 10/1987 | Waterworth . |
| 4,706,264 | 11/1987 | Cung . |
| 4,749,983 | 6/1988 | Langdon, Jr. . |
| 4,774,500 | 9/1988 | Lichty . |
| 4,783,841 | 11/1988 | Crayson . |
| 4,796,003 | 1/1989 | Bentley et al. . |
| 4,814,746 | 3/1989 | Miller et al. . |
| 4,839,649 | 6/1989 | Imai et al. . |
| 4,847,619 | 7/1989 | Kato et al. . |
| 4,857,993 | 8/1989 | Music et al. . |
| 4,862,167 | 8/1989 | Copeland, III . |
| 4,866,440 | 9/1989 | Tsukiyama et al. . |
| 4,870,415 | 9/1989 | Van Maren et al. . |
| 4,870,479 | 9/1989 | Dubner . |
| 4,872,009 | 10/1989 | Tsukiyama et al. . |
| 4,876,541 | 10/1989 | Storer . |
| 4,881,075 | 11/1989 | Weng . |
| 4,882,754 | 11/1989 | Weaver et al. . |
| 4,891,643 | 1/1990 | Mitchell et al. . |
| 4,899,147 | 2/1990 | Schiavo et al. . |
| 4,899,148 | 2/1990 | Sato et al. . |
| 4,910,751 | 3/1990 | Einarsson . |
| 5,003,307 | 3/1991 | Whiting et al. ............... 341/51 |
| 5,049,881 | 9/1991 | Gibson et al. . |
| 5,051,745 | 9/1991 | Katz . |
| 5,058,144 | 10/1991 | Fiala et al. . |
| 5,155,484 | 10/1992 | Chambers, IV . |
| 5,339,076 | 8/1994 | Jiang ............... 341/51 |

OTHER PUBLICATIONS

Comer, D. et al. "Hash–Bucket Search: A Fast Technique for Searching an English Spelling Dictionary," Software—Practice and Experience, vol. 12, pp. 669–682, 1982.

Cowan, R. et al. "Hashing—The Key to Rapid Pattern Matching," Proceedings, Eurosam, lecture Notes in Computer Science 72, Springer–Verlag, Marsaille, pp. 266–278, 1979.

Davison, G., "Rapidly Searching for Character String Matches Using Hash Coding," IBM Technical Disclosure Bulletin, vol. 16, No. 1, p. 64, 1973.

Davisson, L. et al., "Efficient Universal Noiseless Source Codes," IEEE Transactions on Information Theory, vol. IT–27, No. 3, pp. 269–279, 1981.

Dewan, H. et al., "Data Compression by Textual Substitution Some Implementation Schemes and Results," Technical Report CS–83–113, Brandeis University, 1983.

Dimsdale, J. et al., "File Structure for an On–Line Catalog of One Million Titles," Journal of library Automation, vol. 6, No. 1, pp. 37–55, 1973.

Ellzey, R., "Data Structures for Computer Information Systems,"Science Research Associates, 1982.

Fiala, E. et al. "Data Compression with Finite Windows," Communications of the ACM 32(4): 490–505, Apr., 1989.

Floyd, R., "Application of Data Compression Techniques on Computer–Based Text and Program Source Libraries," Thesis, College of Engineering, Florida Atlantic University, 1977.

Floyd, R., "Data Base Compression through Combined Software Techniques," IBM Technical Disclosure Bulletin, vol. 21, No. 2, pp. 458–462, 1978.

Gallant, J., "Optimal String Compression" EECS Department, Princeton Univ., pp. 1–10. (No Date Given by Applicant).

Goble, C., "A Free–text Retrieval System using Hash Codes," The Computer Journal, vol. 18, pp. 18–20, 1975.

Goto, E., et al., "Studies on Hashing Part–2: Algorithms and Programming with CAMs," Journal of Information Processing, vol. 3, No. 1, pp. 13–22, 1980.

Harrison, M., "Implementation of the Substring Test by Hashing," Communications of the ACM 14(12): 777–779, 1971

Heaps, H., "Data Compression of Large Document Data Bases," Journal of Chemical Information and Computer Sciences, vol. 15, No. 1, pp. 32–39, 1975.

Heaps, H., "Information Retrieval: Computational and Theoretical Aspects," Academic Press, Introduction, Chapter 5 and Chapter 9, 1978.

Hegazy, "Searching Large Textual Files for Near Matching Patterns," The George Washington Univ., 1985.

Hopgood, "Compiling Techniques," American Elsevier Publishing Company, Inc., pp. 1–28, 1969.

Horowitz and Sahni, "Fundamentals of Data Structures in Pascal," (2d ed.) 1987.

Horowitz and Sahni, "Fundamentals of Data Structures in Pascal," (4th ed.) W. H. Freeman and Company, pp. 425–457, 1990.

Kara, T., "Recent Advances in Data Compression Theory," J. of Japan Electronic Communications Society, vol. 67, No. 3, pp. 288–292 (1984).

Karp, R., et al., "Efficient Randomized Pattern–Matching Algorithms," Harvard Univ. Center for Research in Computing Technology, pp. 1–39, 1981.

Knuth, D., "Algorithms," Scientific American, Apr., 1977, p. 63 et. seq.

Kohonen, T. "Content Addressable Memories," Spring Series in Information Sciences, vol. 1, pp. 1–124 and 253–263, 1980.

Kohonen, T., et al., "A Very Fast Associative Method for the Recognition and Correction of Misspelt Words, Based on Redundant Hash Addressing," Proc. 4th Int. Joint Conf. on Pattern Recognition, Kyoto, pp. 807–809, 1978.

Kohonen, T. et al., "A Thousand–Word Recognition System Based on the Learning Subspace Method and Redundant Hash Addressing," Proc. 5th Int. Conf. on Pattern Recognition, Miami, pp. 158–165, 1980.

Lindsay, R. et al., "Universal Data Compression," International Telemetering Conference Proceedings, pp. 117–124, 1985.

Lynch, M., "Creation of Bibliographic Search Codes for Hash–addressing Using the Variety–Generator Method," Program, vol. 9, No. 2, pp. 46–55, 1975.

Miller, V. et al., "Variations on a Theme by Lempel and Ziv," IBM, 1982.

Munakata, S., "Ziv–Lempel Data Compression Algorithm," J. Information Processing Society of Japan, vol. 27, No. 1, pp. 2–6, Jan., 1985 (with translation).

Rabin, M., "Discovering Repetitions in Strings," Combinatorial Algorithms on Words, Apostolico and Galil eds. NATO ASI Series, vol. F12, pp. 279–288, 1985 (presented in Italy, Jun., 1984).

Reghbati, H. et al., "An Overview of Data Compression Techniques," Computer, vol. 14, No. 4, pp. 71–75, 1981.

Reuhkala, E., "Recognition of Strings of Discrete Symbols with Special Application to Isolated Word Recognition," ACTA Polytechnica Scandinavica Mathematics and Computer Science Series No. 38, pp. 1–92, 1983.

Reukhala, E., "Pattern Recognition for Strings of Discrete Symbols," Proc. 6th Int. Conf. on Pattern Recognition, Munich, pp. 969–972, 1982.

Rivest, R., "Partial–Match Retrieval Algorithms," Siam J. Computing, vol. 5, No. 1, pp. 19 et seq., 1976.

Rodeh, M., "String Matching Algorithms and Their Application to Data Compression," Thesis, Isreal Institute of Technology, pp. i–40, 1976 (and translation).

Rodeh, M. et al., "A Linear Algorithm for Finding Repetitions and its Applications in Data Compression," Technicon–Israel Institute of Technology, Department of Computer Science, Haifa, Technical Report No. 72, pp. 1–32, 1976.

Ryan, D. et al., "Data Compression Experiments Using Sliding Dictionaries," Technical Report CS–84–117, Brandeis University, 1984.

Schuegraf, E., "A Survey of Data Compression Methods for Non–Numeric Records," Canadian Journal of Information Science, vol. 2, No. 1, pp. 93–105, 1977.

Schuegraf, E. et al., "A Comparison of Algorithms for Data Base Compression by Use of Fragments as Language Elements," ISR vol. 10, No. 9/10–B, pp. 309–319, 1974.

Sedgewick, R., "Algorithms" Addison–Wesley, 1984.

Severance, D., "Identifier Search Mechnisms: A Survey and Generalized Model," Computing Surveys, vol. 6, No. 3, pp. 175–194, 1974.

Storer, J. et al., "The Macro Model for Data Compression," 1977.

Tharp, A. et al., "The Practicality of Text Signatures for Accelerating String Searching," Software—Practice and Experience, vol. 12, pp. 35–44, 1982.

Wagner, R., "Common Phrases and Minimum–Space Text Storage," Communications of the ACM 16(3): 148–152, 1973.

Waterworth Design Memo, "Some Notes on the Subject of File Compression, Issue 2." (No Date on Reference).

Waterworth Source code. (No Date on Reference).

Whiting, D., "Bit–Serial Reed–Solomon Decoders in VLSI," Thesis, California Institute of Technology, 1985.

Willett, P., "Document Retrieval Experiments Using Indexing Vocabularies of Varying Size. 11. Hashing, Truncation, Diagram and Trigram Encoding of Index Terms," Journal of Documentation, vol. 35, No. 4, pp. 296–305, 1979.

Wipke, W. et al., "Hash Functions for Rapid Storage and Retrieval of Chemical Structures," J. Chem, Inf. Comput. Sci. vol. 18, No. 1, pp. 32–37, 1978.

Wirth, "Algorithms + Data Structures = Programs," 1976.

Yamamoto, H. et al., "Improvement of Ziv–Lempel code and evaluation of efficiency by simulation (II)," Papers of Technical Group on Communication Systems, IECE, Japan, CS84–135 (Jan., 1985).

Zamora, A., "Automatic Detection and Correction of Spelling Errors in a Large Data Base,:" Journal of the American Society for Information Science, pp. 51–57, 1980.

Aho, Hopcroft and Ullman, *The Design and Analysis of Computer Algorithms*, pp. 111–113, 145–147 (1974).

P. A. Alsberg, "Space and Time Savings Through Large Data Base Compression and Dynamic Restructuring," *Proceedings of the IEEE*, vol. 63, No. 8, pp. 1114–1122, Aug. 1975.

A. Apostolico and E. Guerrieri, "Linear Time Universal Compression Techniques For Dithered Images Based on Pattern Matching," (extended abstract), *Proceedings Twenty–First Allerton Conference on Communications, Control, and Computing*, Monticello, Illinois, pp. 70–79 (1975).

Augenstein and Tenenbaum, *Data Structures and PL/I Programming*, pp. 534–542 (1979).

M. F. Barnsley and A. D. Sloan, "A Better Way to Compress Images," *Byte*, Jan. 1988, pp. 215–223.

J. L. Bentley, D. D. Sleator, R. E. Tarjan, and V. K. Wei, "A Locally Adaptive Data Compression Scheme," *Communications of the ACM*, vol. 29, No. 4, Apr., 1986, pp. 320–330.

J. G. Cleary and I. H. Witten, "Data Compression Using Adaptive Coding and Partial String Matching," *IEEE Transactions on Communications*, vol. 33, No. 4, Apr. 1984, pp. 396–403.

M. Cohn, "Performance of Lempel–Ziv Compressors with Deferred Innovation," Brandeis University, Technical Report TR–88–132, Apr., 1988.

D. Cooper and M. F. Lynch, "Text Compression Using Variable to Fixed–Length Encodings," *Journal of the American Society for Information Science*, Jan., 1982, pp. 18–31.

G. V. Cormack, "Data Compression On A Database System," *Communications of the ACM*, vol. 28, No. 12, Dec., 1985, pp. 1336–1342.

D. L. Dance and U. W. Pooch, "An Adaptive On Line Data Compression System," *The Computer Journal*, vol. 19, No. 3, Aug., 1976, pp. 216–224.

L. D. Davisson and R. M. Gray, "Advances in Data Compression," *Advances in Communication Systems Theory and Applications*, vol. 4, pp. 199–228 (1975).

S. Even and M. Rodeh, "Economical Encoding of Commas Between Strings," *Communications of the ACM*, vol. 21, No. 4, Apr., 1978, pp. 315–317.

N. Faller, "An Adaptive System for Data Compression," *Conference Record of the Seventh IEEE Asilomar Conference on Circuits and Systems*, pp. 593–597 (1973).

A. S. Fraenkel and S. T. Klein, "Novel Compression of Sparse Bit–Strings—Preliminary Report," *Combinatorial Algorithms on Words*, pp. 169–183, (1985).

A. S. Fraenkel, M. Mor and Y. Perl, "Is Text Compression by Prefixes and Suffixes Practical?", *Acta Informatica*, vol. 20, pp. 371–389 (1983).

W. D. Frazer, "Compression Parsing Of Computer File Data," *First USA–Japan Computer Conference*, pp. 609–615 (1972).

H. Fujiwara and K. Kinoshita, "On Testing Schemes for Test Data Compression," *Transactions of the IECE of Japan*, vol. E 61, No. 6, Jun., 1978, p. 504.

J. Gallant, D. Maier, and J. A. Storer, "On Finding Minimal Length Superstrings," *Journal of Computer and System Sciences*, vol. 20, pp. 50–58 (1980).

A. Gamal and A. Orlitsky, "Interactive Data Compression," *Proceedings of the Twenty–Fifth Annual Symposium on Foundations of Computer Science*, Oct. 24–26, 1984, pp. 100–108.

A. V. Goldberg, "Compression and Ranking," *Proceedings of the Seventeenth Annual ACM Symposium on Theory of Computing*, May 6–8, 1985, pp. 440–448.

S. W. Golomb, "Run–Length Encodings," *IEEE Transactions on Information Theory*, vol. 12, Jul., 1966, pp. 399–401.

M. E. Gonzalez Smith and J. A. Storer, "Parallel Algorithms for Data Compression," *Journal of the Association for Computing Machinery*, vol. 32, No. 2, Apr., 1985, pp. 344–373.

D. Gottlieb, S. A. Haberth, P. G. H. Lehot and H. S. Rabinowitz, "A Classification of Compression Methods and their Usefulness for a Large Data Processing Center," *National Computer Conference*, 1975, pp. 453–458.

L. J. Guibas, "Periodicities in Strings," *Combinatorial Algorithms on Words*, pp. 257–269 (1985).

B. Hahn, "A New Technique for Compression and Storage of Data," *Communications of the ACM*, vol. 17, No. 8, Aug., 1974, pp. 434–436.

A. Hartman and M. Rodeh, "Optimal Parsing of Strings," *Combinatorial Algorithms on Words, pp. 155–167 (1985)*.

G. Held, *Data Compression: Techniques and Applications, Hardware and Software Considerations*, (second edition 1987).

R. N. Horspool and G. V. Cormack, "A General–Purpose Data Compression Technique with Practical Computer Applications," *Proceedings of the CIPS*, Session 84, pp. 138–141 (1984).

D. A. Huffman, "A Method for the Construction of Minimum–Redundancy Codes," *Proceedings of the I.R.E.*, Sep., 1952, pp. 1098–1101.

D. W. Jones, "Application of Splay Trees To Data Compression," *Communications of the ACM*, vol. 31, No. 8, Aug., 1988, pp. 996–1007.

D. E. Knuth, "Dynamic Huffman Coding," *Journal of Algorithms*, vol. 6, pp. 163–180 (1985).

Knuth, *Sorting and Search: The Art of Computer Programming*, pp. 506–549 (vol. 3, 1973).

D. E. Knuth, J. H. Morris, and V. R. Pratt, "Fast Pattern Matching in Strings," *SIAM Journal of Computing*, vol. 6, No. 2, Jun. 1977, pp. 323–350.

G. G. Langdon, Jr., "A Note on the Ziv–Lempel Model for Compressing Individual Sequences," *IEEE Transactions on Information Theory*, vol. IT–29, No. 2, Mar., 1983, pp. 284–287.

L. L. Larmore, "Length Limited Coding and Optimal Height–Limited Binary Trees," University of California, Irvine, Technical Report 88–01, Jan. 1988.

D. A. Lelewer and D. S. Hirschberg, "Data Compression," *ACM Computing Surveys*, vol. 19, No. 3, Sep., 1987, pp. 261–296.

A. Lempel, G. Seroussi and J. Ziv, "On the Power of Straight–line Computations in Finite Fields," *IEEE Transactions on Information Theory*, vol. IT–28, No. 6, Nov., 1982, pp. 875–880.

A. Lempel and J. Ziv, "On the Complexity of Finite Sequences," *IEEE Transactions on Information Theory*, vol. IT–22, No. 1, Jan., 1976, pp. 75–81.

A. Lempel and J. Ziv, "Compression of Two–Dimensional Data," *IEEE Transactions on Information Theory*, vol. IT–32, No. 1, Jan., 1986, pp. 2–8.

A. Lempel and J. Ziv, "Compression of Two–Dimensional Images," *Combinatorial Algorithms on Words*, pp. 141–154 (1985).

J. A. Llewellyn, "Data Compression for a Source with Markov Characteristics," *The Computer Journal*, vol. 30, No. 2, pp. 149–156 (1987).

B. A. Marron and P. A. D. De Maine, "Automatic Data Compression," *Communications of the ACM*, vol. 10, No. 11, Nov., 1967, pp. 711–715.

A. Mayne and E. B. James, "Information Compression by Factorising Common Strings," *The Computer Journal*, vol. 18, No. 2, May, 1975, pp. 157–160.

J. P. McCarthy, "Automatic File Compression," *International Computing Symposium* 1973, pp. 511–516.

E. M. McCreight, "A Space–Economical Suffix Tree Construction Algorithm," *Journal of the Association for Computing Machinery*, vol. 23, No. 1, Apr., 1976, pp. 262–272.

V. S. Miller and M. N. Wegman, "Variations on a Theme by Lempel and Ziv," *Combinatorial Algorithms on Words*, pp. 131–140 (1985).

J. H. Mommens and J. Raviv, "Coding for Data Compaction," IBM Watson Res. Report RC5150, Nov. 1974.

J. Pike, "Text Compression Using a 4–Bit Coding Scheme," *The Computer Journal*, vol. 24, No. 4, pp. 324–330 (1981).

J. H. Reif and J. A. Storer, "Real–Time Dynamic Compression of Video on a Grid–Connected Parallel Computer," *Third International Conference on Supercomputing*, May 15–20, 1988, pp. 453–462.

J. Rissanen, "A Universal Data Compression System," *IEEE Transactions on Information Theory*, vol. IT–29, No. 5, Sep., 1983, pp. 656–664.

M. Rodeh, V. R. Pratt, and S. Even, "Linear Algorithms for Data Compression via String Matching," *Journal of the Association for Computing Machinery*, vol. 28, No. 1, Jan., 1981, pp. 16–24.

I. Rubin, "Data Compression for Communication Networks: The Delay–Distortion Function," *IEEE Transactions on Information Theory*, vol. IT–22, No. 6, Nov., 1977, pp. 655–665.

D. G. Severance, "A Practitioner's Guide to Data Base Compression," *Information Systems*, vol. 8, No. 1, pp. 51–62 (1983).

J. A. Storer, "Parallel Algorithms For On–Line Dynamic Data Compression," *IEEE International Conference on Communications* 1988, pp. 385–389.

J. A. Storer, "Textual Substitution Techniques for Data Compression," *Combinatorial Algorithms on Words*, pp. 111–129 (1985).

J. A. Storer and T. G. Szymanski, "Data Compression via Textual Substitution," *Journal of the Association for Computing Machinery*, vol. 29, No. 4, Oct., 1982, pp. 928–951.

J. A. Storer and T. G. Szymanski, "The Macro Model for Data Compression," (extended abstract), *Tenth Annual ACM Symposium on Theory of Computing*, pp. 30–39 (1978).

B. Varn, "Optimal Variable Length Codes (Arbitrary Symbol Cost and Equal Code Work Probability)," *Information and Control*, vol. 19, pp. 289–301 (1971).

U. Vishkin, "Optimal Parallel Pattern Matching in Strings," (extended summary), *Lecture Notes in Computer Science*, pp. 497–508 (1985).

P. Weiner, "Liner Pattern Matching Algorithms," *Fourteenth Annual Symposium on Switching & Automata Theory*, Oct. 15–17, 1973, pp. 1–11.

T. A. Welch, "A Technique for High–Performance Data Compression," *IEEE Computer, Jun., 1984, pp. 8–19.*

M. Wells, "File Compression Using Variable Length Encodings," *The Computer Journal*, vol. 15, No. 4, Nov., 1972, pp. 308–313.

J. Ziv, "Coding Theorems for Individual Sequences," *IEEE Transactions on Information Theory, vol. IT–24, No. 6, Jul. 1978, pp. 405–412.*

J. Ziv, "On Universal Quantization," *IEEE Transactions on Information Theory*, vol. IT–31, No. 3, May, 1985, pp. 344–347.

J. Ziv and A. Lempel, "A Universal Algorithm for Sequential Data Compression," *IEEE Transactions on Information Theory*, vol. IT–23, No. 3, May, 1977, pp. 337–343.

J. Ziv and A. Lempel, "Compression of Individual Sequences Via Variable–Rate Coding," *IEEE Transactions on Information Theory*, vol. IT–24, No. 5, Sep., 1978, pp. 530–536.

J. K. Gallant, "String Compression Algorithms," Ph.D. Dissertation, Department of Electrical Engineering and Computer Science, Princeton University, 1982.

J. A. Storer, *Data Compression: Methods and Theory* (1988).

J. A. Storer, "Data Compression: Method and Complexity Issues," Ph.D. Dissertation, Department of Electrical Engineering and Computer Science, Princeton University, 1979.

T. Bell, J. Cleary & I. Witten, *Text Compression* (1990).

M. Nelson, *The Data Compression Book* (1992).

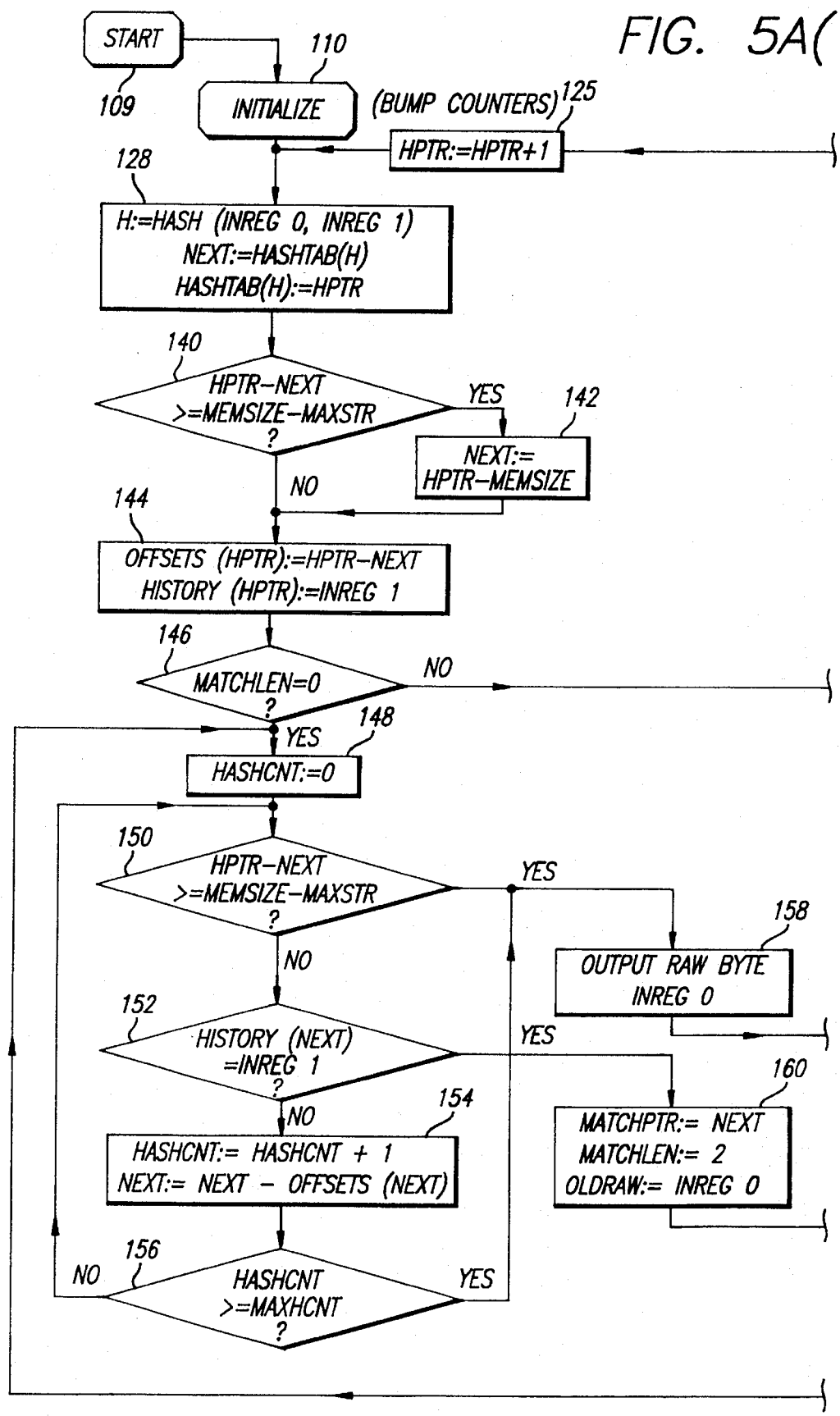
FIG. 5A(1)

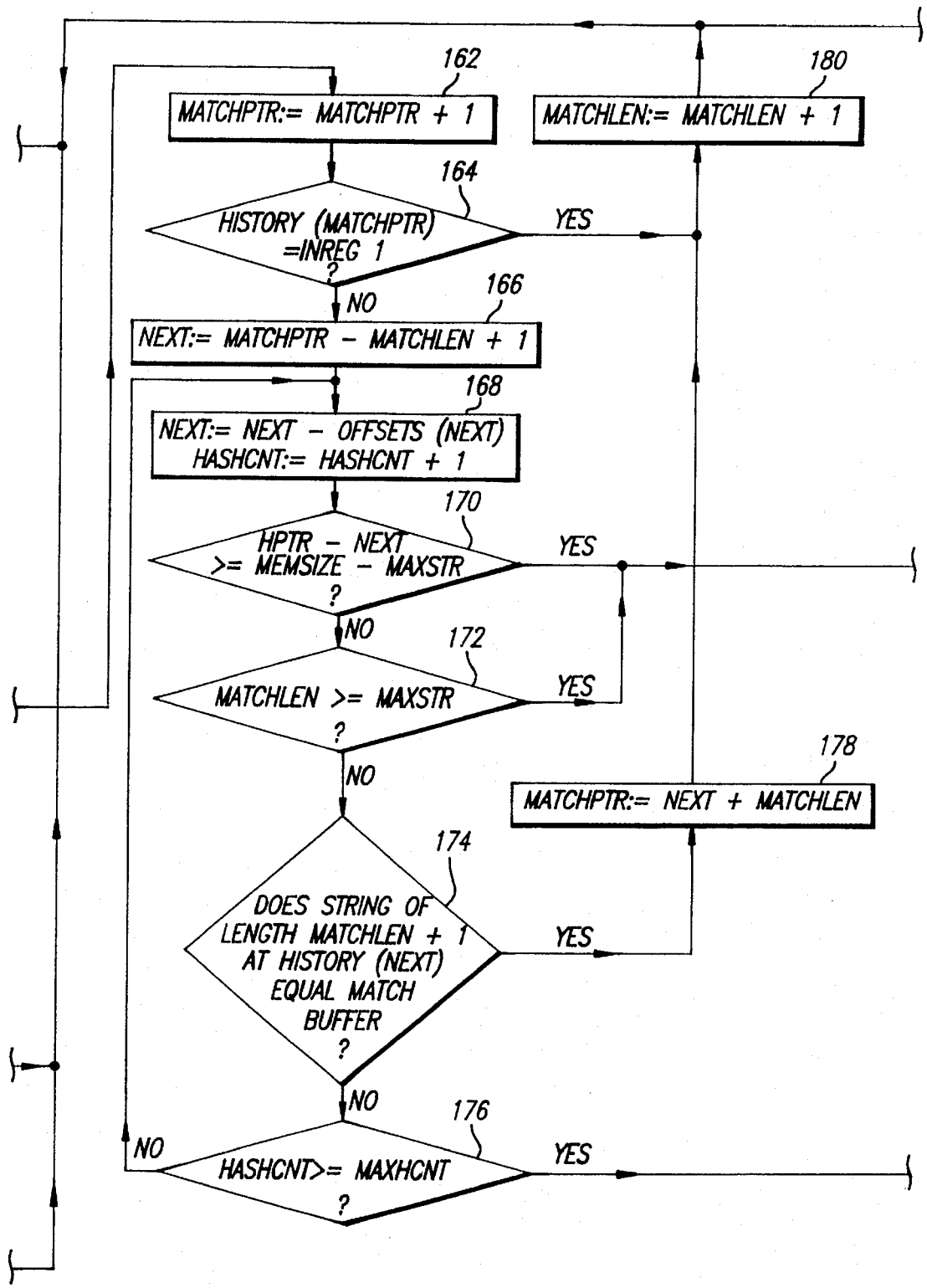
FIG. 5A(2)

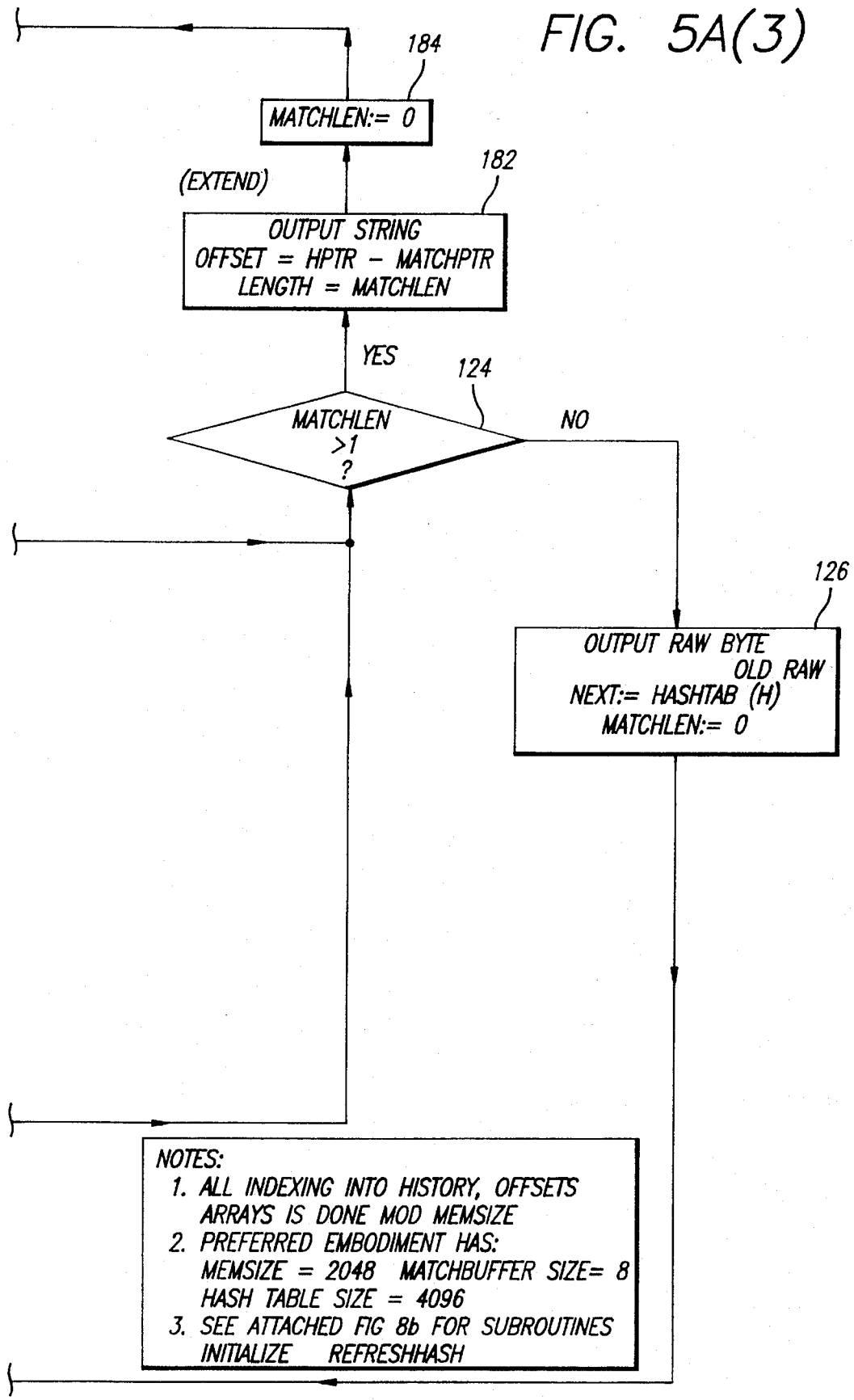
FIG. 5A(3)

502 — 00bbbbb          OFFSETS   1− 32
504 — 01bbbbbbb         OFFSETS  33− 160
506 — 10bbbbbbbbb       OFFSETS 161− 672
508 — 11bbbbbbbbbbb     OFFSETS 673−2047

| HUFFMAN BINS 450 | BIN DESCRIPTION 452 | EXTRA OFFSET BITS 454 |
|---|---|---|
| 462 ↙ 0 – 255 | RAW BYTES 0-255 | |
| 464 ↙ 256 – 258 | STRING, LENGTH 3,4,5 OFFSET 1 | 0 |
| 259 – 261 | STRING, LENGTH 3,4,5, OFFSET 2 | 0 |
| 262 – 264 | STRING, LENGTH 3,4,5, OFFSET 3 | 0 |
| 265 – 267 | STRING, LENGTH 3,4,5, OFFSET 4-5 | 1 |
| 268 – 270 | STRING, LENGTH 3,4,5, OFFSET 6-7 | 1 |
| 271 – 273 | STRING, LENGTH 3,4,5, OFFSET 8-11 | 2 |
| 274 – 276 | STRING, LENGTH 3,4,5, OFFSET 12-15 | 2 |
| 277 – 279 | STRING, LENGTH 3,4,5, OFFSET 16-23 | 3 |
| 280 – 282 | STRING, LENGTH 3,4,5, OFFSET 24-31 | 3 |
| 283 – 285 | STRING, LENGTH 3,4,5, OFFSET 32-47 | 4 |
| 286 – 288 | STRING, LENGTH 3,4,5, OFFSET 38-63 | 4 |
| 289 – 291 | STRING, LENGTH 3,4,5, OFFSET 64-95 | 5 |
| 292 – 294 | STRING, LENGTH 3,4,5, OFFSET 96-127 | 5 |
| 466 ↙ 295 – 297 | STRING, LENGTH 3,4,5, OFFSET 128-191 | 6 |
| 298 – 300 | STRING, LENGTH 3,4,5, OFFSET 192-255 | 6 |
| 301 – 303 | STRING, LENGTH 3,4,5, OFFSET 256-383 | 7 |
| 304 – 306 | STRING, LENGTH 3,4,5, OFFSET 384-511 | 7 |
| 307 – 309 | STRING, LENGTH 3,4,5, OFFSET 512-767 | 8 |
| 310 – 312 | STRING, LENGTH 3,4,5, OFFSET 768-1023 | 8 |
| 313 – 315 | STRING, LENGTH 3,4,5, OFFSET 1024-1535 | 9 |
| 316 – 318 | STRING, LENGTH 3,4,5, OFFSET 1536-2047 | 9 |
| 468 ↙ 319 – 333 | STRING, LENGTHS 6-20 | (SEE FIGURE 10) |
| 470 ↙ 334 | STRING, LENGTH 21 AND ABOVE (FIGURE 11) | (SEE FIGURE 10) |
| 472 ↙ 335 | END OF COMPRESSED DATA | |

FIG. 9

| STRING LENGTH (520) | EXTRA LENGTH BITS (522) |
|---|---|
| 21 | 0000 |
| 22 | 0001 |
| 23 | 0010 |
| 24 | 0011 |
| 25 | 0100 |
| ... | |
| 35 | 1110 |
| 36 | 1111 00000000 |
| 37 | 1111 00000001 |
| 38 | 1111 00000010 |
| ... | |
| 290 | 1111 11111110 |
| 291 | 1111 11111111 000000000000 |
| 292 | 1111 11111111 000000000001 |
| 293 | 1111 11111111 000000000010 |
| ... | |
| 4387 | 1111 11111111 111111111110 |
| 4388 | 1111 11111111 111111111111 0000000000000000 |
| 4389 | 1111 11111111 111111111111 0000000000000001 |
| ... | |
| 69922 | 1111 11111111 111111111111 1111111111111110 |
| 69923 | 1111 11111111 111111111111 1111111111111110 0000000000000000 |
| 69924 | 1111 11111111 111111111111 1111111111111110 0000000000000001 | etc.

FIG. 11

*(in C programming language)*

```
       void AssignCodes
          (
540 {     int lengths[ ],   /* array of lengths for each code */
          long codes[ ],    /* array of Huffman codes (up to 32 bits each) */
          unsigned size     /* number of entries in lengths[ ] array */
          )
       {
          long     base[32];
          long     baseVal=0;
          unsigned freq[32];
          unsigned lastFreq=0;
          unsigned i;

542 {     for (i=0 ; i<32  ; i++) freq[i]=0;  /* init frequency counts */

544 {     for (i=0 ; i<size ; i++)
              freq[lengths[i]]++;              /* count number of each len */ for (i=1 ; i<32  ; i++)
              if (freq[i])
              {
546 {             baseVal <<= (i-lastFreq);    /* assign base codes */
                  base[i]    = baseVal;
                  baseVal   += freq[i];
                  lastFreq   = i;
              } for (i=0 ; i<size ; i++)
548 {         if (lengths[i])                  /* assign actual bin codes */
                  codes[i] = base[lengths[i]]++;
          }
```

FIG. 12

```
570⟋<LENGTHTABLE>     ::= <SEGMENT> <SEGMENT> <SEGMENT> ···
                             ┌574          ┌576            ┌580
572⟋<SEGMENT>         ::= <ZEROCOUNT><NONZERO COUNT><NONZERO LENGTHS>
                          ┌578
574⟋<ZEROCOUNT>       ::= <COUNT>
                             ┌578
576⟋<NONZEROCOUNT>    ::=<COUNT>

578⟋<COUNT>           ::= 0000           | /*END OF TABLE */
                          0001           | /* COUNT OF 1 */
                          0010           | /* COUNT OF 2 */
                          0011           | /* COUNT OF 3 */
                          0100           | /* COUNT OF 4 */
                          ...
                          1110           | /* COUNT OF 14 */
                          1111 XXXXXXXX  | /* COUNT OF 15-270 */

580⟋<NONZERO LENGTHS>:= 0000             | /* END OF TABLE */
                        0001             | /* LENGTH = 1 */
                        ...
                        1111             | /* LENGTH = 15 */

582⟋EXAMPLE (ALL QUANTITIES ARE FOUR-BIT "NIBBLES"):

584⟋ LENGTH TABLE = 0,0,0,0,8,9,1,0,5,4,0,0,0

586⟋ ENCODED     = 4,3,8,9,1,      /*FOUR ZEROS, THREE NONZERO */
                     1,2,5,4,         /* ONE ZERO, TWO NONZERO */
                     3,0              /* THREE ZEROS, END OF TABLE */
```

FIG. 13

INPUT BYTE STREAM: (29 BYTES OF ASCII TEXT)
"THIS IS A SMALL SMALL EXAMPLE"

| TOKEN (600) | HUFFMAN BIN (602) |
|---|---|
| RAW 'T' | 116 |
| RAW 'H' | 104 |
| RAW 'I' | 105 |
| RAW 'S' | 115 |
| RAW ' ' | 32 |
| STRING, LEN=3, OFFSET=3 | 262 |
| RAW 'A' | 97 |
| RAW ' ' | 32 |
| RAW 'S' | 115 |
| RAW 'M' | 109 |
| RAW 'A' | 97 |
| RAW 'L' | 108 |
| RAW 'L' | 108 |
| STRING, LEN=7, OFFSET=6 | 320 |
| RAW 'E' | 101 |
| RAW 'X' | 120 |
| RAW 'A' | 97 |
| RAW 'M' | 109 |
| RAW 'P' | 112 |
| RAW 'L' | 108 |
| RAW 'E' | 101 |
| END OF COMPRESSED DATA | 335 |

| BIN # (610) | BIN COUNT (612) | HUFFMAN LENGTH (614) | HUFFMAN CODE (616) |
|---|---|---|---|
| 32 | 2 | 3 | 000 |
| 97 | 3 | 3 | 001 |
| 101 | 2 | 3 | 010 |
| 104 | 1 | 5 | 11010 |
| 105 | 1 | 5 | 11011 |
| 108 | 3 | 3 | 011 |
| 109 | 2 | 4 | 1010 |
| 112 | 1 | 5 | 11100 |
| 115 | 2 | 3 | 100 |
| 116 | 1 | 5 | 11101 |
| 120 | 1 | 5 | 11110 |
| 262 | 1 | 5 | 11111 |
| 320 | 1 | 4 | 1011 |
| 335 | 1 | 4 | 1100 |

COMPRESSED HUFFMAN TABLE (ALL QUANTITIES ARE HEX NIBBLES):

```
  ┌─620─┐              ┌──────────622──────────┐
  F 20 1 2     /* 32   ZEROS, ONE NONZERO (32),  LEN=2   */
  F 40 1 3     /* 64   ZEROS, ONE NONZERO (97),  LEN=3   */
  3    1 3     /*  3   ZEROS, ONE NONZERO (101), LEN=3   */
  2    2 5 5   /*  2   ZEROS, TWO NONZERO     ,  LEN=5,5 */
  2    2 3 4   /*  2   ZEROS, TWO NONZERO     ,  LEN=3,4 */
  2    1 5     /*  2   ZEROS, ONE NONZERO (112), LEN=5   */
  2    2 3 5   /*  2   ZEROS, TWO NONZERO     ,  LEN=3,5 */
  3    1 5     /*  3   ZEROS, ONE NONZERO (120), LEN=5   */
  F 8D 1 5     /* 141  ZEROS, ONE NONZERO (262), LEN=5   */
  F 39 1 4     /* 57   ZEROS, ONE NONZERO (320), LEN=4   */
  E    1 4     /* 14   ZEROS, ONE NONZERO (335), LEN=4   */
  0            /* END OF TABLE */
```

FIG. 14c

ENCODED TOKENS (BIT STREAM):

```
  ┌──630──┐              ┌──632──┐
  11101          /* 116   'T'    */
  11010          /* 104   'H'    */
  11011          /* 105   'I'    */
  100            /* 115   'S'    */
  000            /*  32   ' '    */
  11111          /* 262          */
  001            /*  97   'A'    */
  000            /*  32   ' '    */
  100            /* 115   'S'    */
  1010           /* 109   'M'    */
  001            /*  97   'A'    */
  011            /* 108   'L'    */
  011            /* 108   'L'    */
  1011 00 00101  /* 320, OFFSET=6 */
  010            /* 101   'E'    */
  11110          /* 120   'X'    */
  001            /*  97   'A'    */
  1010           /* 109   'M'    */
  11100          /* 112   'P'    */
  011            /* 108   'L'    */
  010            /* 101   'E'    */
  1100           /* 335   EOCD   */
```

FIG. 14d

OUTPUT BYTE STREAM (TABLE + ENCODED TOKENS):

640 — F2 01 2F 40 13 31 32 25 52 23 42 15 22 35
31 5F 8D 15 F3 91 4E 14 0E EB 70 7C 89 45
BB 0A BC 6B 8D 60

OUTPUT WORD STREAM:

642 — 01F2 402F 3113 2532 2352 1542 3522
5F31 158D 91F3 144E EB0E 7C70 4589
0ABB 6BBC 608D

| ADDRESS | TAG BIT | CHILD/BIN |
|---|---|---|
| A0: | LEAF | BIN 0 |
| A1: | PARENT | CHILD = A2 |
| A2: | LEAF | BIN 1 |
| A3: | PARENT | CHILD = A4 |
| A4: | LEAF | BIN 2 |
| A5: | LEAF | BIN 3 |

CORRESPONDING HUFFMAN CODES

BIN 0 <---> 0
BIN 1 <---> 10
BIN 2 <---> 110
BIN 3 <---> 111

DATA COMPRESSION APPARATUS AND METHOD USING MATCHING STRING SEARCHING AND HUFFMAN ENCODING

REFERENCE TO RELATED PATENT APPLICATIONS

The following patent application is a continuation of application Ser. No. 07/927,343, filed Aug. 10, 1992, which is now abandoned is a continuation-in part application of United States Patent Application entitled "Data Compression Apparatus and Method" to Douglas L. Whiting, Ph.D., Ser. No. 870,554, filed Apr. 17, 1992, which is a now U.S. Pat. No. 5, 146,221 continuation of Ser. No. 619,291, filed Nov. 27, 1990, which is a divisional of Ser. No. 297,152, filed Jan. 13, 1989, now U.S. Pat. No. 5,016,009, issued May 14, 1991. The entire disclosure of the Ser. No. 297,152 patent application is hereby incorporated by reference.

FIELD OF THE INVENTION

The present invention relates generally to data storage and communication systems, and particularly to data compression systems and methods which improve the capacity of data storage and communication.

BACKGROUND OF THE INVENTION

Due to the insignificant differences between data compression in data storage and data communication systems, only data storage systems are referred to, particularly the data files stored in such systems. However, all data storage systems can easily be extended to cover data communications systems and other applications as well. A file is assumed to be a sequential stream of bytes or characters, where a byte consists of some fixed number of bits (typically 8), and the compression system transforms this input byte stream into a "compressed" output stream of bytes from which the original file contents can be reconstructed by a decompression unit.

It is well-established that computer data files typically contain a significant amount of redundancy. Many techniques have been applied over the years to "compress" these files so that they will occupy less space on the disk or tape storage medium or so that they can be transmitted in less time over a communications channel such as a 1200 baud modem line. For example, there are several widely used commercial programs available for personal computers (e.g., ARC Software by Systems Enhancement Associates, Inc., Wayne, N.J. 1985) which perform the compression and decompression functions on files. It is not uncommon for such programs to reduce the size of a given file by a 2:1 ratio (or better), although the amount of reduction varies widely depending on the contents of the file.

There are many approaches in the prior art for compressing data. Some of these approaches make implicit assumptions about certain types of files or data within the files. For example, a bit image of a page produced using a scanner typically has most of its pixels blank, and this tendency can be exploited by a compression algorithm to greatly reduce the size of such files. Similarly, word processing files contain many ASCII characters which are easily compressed using knowledge of which characters (or words) occur most frequently in the language of interest (e.g., English). Other compression methods are independent of the file type and attempt to "adapt" themselves to the data. In general, type-specific compression techniques may provide higher compression performance than general-purpose algorithms on the file for which the techniques are optimized, however they tend to have much lower compression performance if the file model is not correct. For instance, a compression method optimized for English text might work poorly on files containing French text.

Typically, a storage system does not "know" what type of data is stored within it. Thus, data-specific compression techniques are avoided, or they are only used as one of a set of possible techniques. For example, ARC uses many methods and picks the one that performs best for each file. However, this approach requires significant computational overhead compared to using a single compression method.

Another important aspect of any compression method is the speed at which a file can be processed. If the speed of compression (or decompression) is so low as to significantly degrade system performance, then the compression method is unacceptable even though it may achieve higher compression ratios than competing methods. For example, with streaming tape systems, if the file cannot be compressed fast enough to provide data at the required rate for the tape drive, the tape will fall out of streaming and the performance and/or capacity gains due to compression will be nullified.

One of the most common compression techniques is known as run-length encoding. This approach takes advantage of the fact that files often have repeated strings of the same byte (character), such as zero or the space character. Such strings are encoded using an "escape" character, followed by the repeat count, followed by the character to be repeated. All other characters which do not occur in runs are encoded by placing them as "plain text" into the output stream. The escape character is chosen to be a seldom used byte, and its occurrence in the input stream is encoded as a run of length one with the escape character itself as the character. Run-length encoding performs well on certain types of files, but can have poor compression ratios if the file does not have repeated characters (or if the escape character occurs frequently in the file). Thus, the selection of the escape character in general requires an extra pass on the data to find the least used byte, lowering the throughput of such a system.

A more sophisticated approach is known as Huffman encoding (see, Huffman, David A., "A Method for the Construction of Minimum Redundancy Codes" Proceedings of the IRE, pp. 1098–1110, September 1952). In this method, it is assumed that certain bytes occur more frequently in the file than others. For example, in English text the letter "t" or "T" is much more frequent than the letter "Q". Each byte is assigned a bit string, the length of which is inversely related to the relative frequency of that byte in the file. These bit strings are chosen to be uniquely decodeable if processed one bit at a time. Huffman derived an algorithm for optimally assigning the bit strings based on relative frequency statistics for the file.

The Huffman algorithm guarantees that asymptotically the compression achieved will approach the "entropy" of the file, which is precisely defined as:

$$H = \text{SUM} - [p(i) \log_2(p(i))],$$

where
$p(i)$ = probability of character $i$ within the file
= (# occurrences of character $i$)/
(total # of characters in file).

The units of H are in bits, and it measures how many bits (on the average) are required to represent a character in the file. For example, if the entropy were 4.0 bits using an 8-bit byte, a Huffman compression system could achieve 2:1 compression on the file. The higher the entropy, the more "random" (and thus less compressible) is the data.

Huffman encoding works very well on many types of files. However, assignment of bit strings to bytes presents many practical difficulties. For example, if a pre-assigned encoding scheme is used (e.g., based on frequency of occurrence of letters in English), Huffman encoding may greatly expand a file if the pre-assigned scheme assumes considerably different frequency statistics than are actually present in the file. Additionally, computing the encoding scheme based on the file contents not only requires two passes over the data as well as applying the Huffman algorithm to the frequency statistics (thus lowering system throughput), but it also requires that the encoding table be stored along with the data, which has a negative impact on the compression ratio. Furthermore, the relative frequency of bytes can easily change dynamically within the file, so that at any point the particular encoding assignment may perform poorly.

There have been many variations on the Huffman approach (e g., Jones, Douglas W., "Application of Splay Trees to Data Compression" Communications of the ACM, pp 996–1007, Vol. 31, No. 8, August 1988) and they usually involve dynamic code assignment based on the recent history of input bytes processed. Such schemes circumvent the problems discussed above. Other approaches include looking at two byte words (bi-grams) at the same time and performing Huffman encoding on the words.

A recent variation of Huffman encoding is present in U.S. Pat. No. 4,730,348 to MacCrisken (and other patents referenced therein). In MacCrisken, Huffman codes are assigned to bytes in the context of the previous byte. In other words, a plurality of encoding tables are used, each table being selected according to the previous byte. This approach is based on the observation that, for example, in English the letter "u" does not occur very frequently, but following a "q" it appears almost always. Thus, the code assigned to "u" would be different depending on whether or not the previous letter was "q" (or "Q"). For a similar scheme using multiple tables and dynamic code assignment see, Jones, Douglas W., "Application of Splay Trees to Data Compression".

The above described Huffman-type approaches tend to be computationally intensive and do not achieve exceptionally high compression ratios. One explanation for this observation is that a pure Huffman code based on 8-bit bytes can achieve at best an 8:1 compression ratio, and only in the optimal situation when the file consists of the same byte repeated over and over (i.e. entropy=0). In the same scenario even a simple run-length encoding scheme could achieve better than a 50:1 compression ratio. The average performance will be some combination of best and worst case numbers, and limiting the best case must also limit the average. A well-known limitation of Huffman coding is that, if the probabilities are not exact powers of two, it cannot achieve the entropy, although it is guaranteed to come within one bit of the theoretical limit. This is due to the fact that all Huffman codes are an exact number of bits in length, while to achieve entropy in all cases would require fractional bit lengths. In other words, Huffman's algorithm suffers from rounding problems. In general, the problem worsens when there are tokens with high probabilities, since a fraction of a bit of "error" is a large percentage of the size of the code assigned.

Arithmetic coding is a well-known technique that can actually overcome the rounding problem. However, the tables required for arithmetic coding are not as compressible as Huffman tables, and performing the arithmetic algorithm dynamically to overcome the table size problem, while possible, is very computationally intensive. The net result is that the gains achieved in practice using arithmetic coding are not as large as would be hoped from a theoretical standpoint.

A totally different approach to compression was developed by Lempel and Ziv (see, Ziv, J. and Lempel, A., "Compression of Individual Sequences via Variable-Rate Coding", IEEE Transactions on Information Theory, Vol. IT-24, pp. 530–536, September 1978) and then refined by Welch (see, Welch, Terry A., "A Technique for High-Performance Data Compression", IEEE Computer, pp. 8–19, June 1984). Instead of assigning variable length codes to fixed size bytes, the Lempel-Ziv algorithm ("LZ") assigns fixed-length codes to variable size strings. As input bytes from the file are processed, a table of strings is built up, and each byte or string of bytes is compressed by outputting only the index of the string in the table. Typically this index is in the range 11–14 bits, and 12 bits is a common number because it lends itself to a simple implementation. Since the table is constructed using only previously encoded bytes, both the compression and the decompression system can maintain the same table without any extra overhead required to transmit table information. Hashing algorithms are used to find matching strings efficiently. At the start of the file, the table is initialized to one string for each character in the alphabet, thus ensuring that all bytes will be found in at least one string, even if that string only has length one.

The Lempel-Ziv algorithm is particularly attractive because it adapts itself to the data and requires no pre-assigned tables predicated on the file contents. Furthermore, since a string can be extremely long, the best case compression ratio is very high, and in practice LZ out-performs Huffman schemes on most file types. It is also quite simple to implement, and this simplicity manifests itself in high throughput rates.

There are also some drawbacks, however, to the LZ compression method. The LZ string search is a "greedy" algorithm. For example, consider the string:

ABCDEFBCDEF;

where A,B,C,D,E,F are any distinct bytes. Note that the LZ string search would add the following strings to its string table: AB, BC, CD, DE, EF, BCD, DEF, the only strings of length two or greater that can be output using this algorithm, up to the point shown, are BC and DE. In actuality the string BCDEF has already occurred in the input. Thus, while ideally the second BCDEF string would be referenced back to the original BCDEF, in practice this does not occur.

A more significant disadvantage to the LZ approach is that the string table for holding the compressed data will tend to fill up on long files. The table size could be increased, however, this approach would require more bits to represent a string and thus it would be less efficient. One approach to handling this deficiency would be to discard all or part of the table when it fills. Because of the structure of the algorithm, the most recently found strings have to be discarded first, since they refer back to previous strings. However, it is the most recent strings that have been dynamically adapting to the local data, so discarding them is also inefficient. Basically, the LZ string table has infinite length memory, so changes in the type of data within the file can cause great encoding inefficiencies if the string table is full.

It is also possible to design a compression system that utilizes more than one method simultaneously, dynamically switching back and forth depending on which method is most efficient within the file. From an implementation standpoint, such a scheme may be very costly (i.e., slow and/or expensive), however the resulting compression rate could be very high.

One such method of dynamically switching back and forth is disclosed in MacCrisken. As mentioned above, a bi-gram Huffman method is utilized as the primary compression technique. Typically the compression and decompression system start with a pre-defined (i.e., static) set of code tables. There may be a set of such tables, perhaps one each for English, French, and Pascal source code. The compression unit (sender) first transmits or stores a brief description of which table is to be used. The decompression unit (receiver) interprets this code and selects the appropriate table. During compression, if it is determined that the current table is not performing well, the sender transmits a special ("escape") Huffman code that tells the receiver to either select another specific pre-defined table or to compute a new table based on the previous data it has decompressed. Both sender and receiver compute the table using the same algorithm, so there is no need to send the entire table, although it takes some time to perform the computation. Once the new table is computed, compression proceeds as before. It should be noted that although there is considerable computational overhead, there is no reason why this technique could not be further adapted to a dynamic Huffman scheme.

In addition to the Huffman encoding, MacCrisken uses a secondary string-based compression method. Both sender and receiver maintain a history buffer of the most recently transmitted input bytes. For each new input byte (A), the bigram Huffman code is generated, but an attempt is also made to find the string represented by the next three input bytes (ABC) in the history using a hashing scheme. The hash is performed on three byte strings and a doubly-linked hash list is maintained to allow discarding of old entries in the hash list. If a string is found, a special Huffman escape code can be generated to indicate that a string follows, and the length and offset of the string in the history buffer is sent. The offset is encoded in 10 bits, while the length is encoded into 4 bits, representing lengths from 3–18 bytes. Before such a string is sent however, the compression unit generates the Huffman codes for all the bytes in the string and compares the size of the Huffman codes with the size of the string bits. Typically the Huffman string escape code is four bits, so it takes 19 bits to represent a string. The smaller of the two quantities is sent.

Note that the MacCrisken string method avoids the problems of the Lempel-Ziv method in that the string "table" never fills up, since the old entries are discarded by removing them from the hash list. Thus, only the most recent (within 1K bytes) strings occupy the table. Also it is not "greedy" since in principle all matching strings can be found. In practice, a limit on the length of the string search is imposed. Additionally, the MacCrisken method is computationally inefficient because it is effectively performing two compression algorithms at once, and thus the computational overhead is quite high.

Other algorithms exist which use a variant of the MacCrisken variation of the Lempel-Ziv technique of maintaining a "sliding window" of the most recent processed bytes of data and scanning the window for strings of matching bytes. If a string is found, the length of the matching string and its offset within the window are output; otherwise, a "raw" byte is output. The encoder portion of the compression engine emits a tag to distinguish between strings and raw bytes, and the strings and raw bytes themselves may be encoded in many ways.

Obviously, since various types of data will have different distributions of string lengths and offsets, a single fixed encoding cannot be optimal for all possible files. Thus, various techniques have been developed to determine the encoding based on the strings found. For example, Huffman coding can be used to encode the string lengths and offsets. In practice, not all lengths and offsets are given an individual Huffman code. Instead, ranges of lengths and offsets may be represented by a single Huffman code, with extra bits following the Huffman code to distinguish between values within the range. These ranges, or bins, are chosen to approximate the distributions typically observed in data.

The extremely compelling advantage of such an approach is that the encoding can be optimized, within the constraints of the bins chosen, for the data being processed so as to minimize the size of its compressed image. One disadvantage of such an approach is that a table of some type describing the encoding format must be sent along with the data, thus counteracting to some extent the extra compression gained by the variable encoding. In practice, for large enough data blocks, this overhead is more than compensated for by the gains in encoding. Another disadvantage is that this type of approach is inherently more complex to implement, whether in hardware or software, than a fixed encoding scheme. Again, the gain in compression ratio often is more important than the increase in complexity. It is possible to modify the encoding dynamically as each byte of data is processed, removing the need for a table, but such a scheme is considerably more complex, typically slowing compression and decompression throughput dramatically without a corresponding dramatic gain in compression ratio. A third disadvantage, which is not significant in many cases, is that this type of algorithm is essentially a two-pass approach, requiring all the data to be processed by the string search engine before any encoded tokens can be output.

In addition to encoding the strings, raw bytes may also be encoded. Using sliding window methods, every item output is either a string or a raw byte, so the raw bytes and strings may be encoded together. For example, a single Huffman code may represent either a raw byte or a string of certain length. Including raw bytes in the encoding tends to grow further the size of the table which specifies the particular encoding used, but this increase in table size is typically overcome by the resulting gain in compression.

PKZIP version 2.0 and LHA version 2.13 are commonly available compression utilities for MS-DOS computers that use this type of compression method. Although the string searching techniques used by these programs are different, the resulting compression formats are extremely similar in style. Not surprisingly, very similar compression ratios result. Each program uses a sliding window and a minimum string length of three, and generates two Huffman tables that are stored as part of the compressed data. The first (and largest) Huffman table encodes raw bytes and string lengths. For example, PKZIP assigns Huffman codes 0–255 to raw bytes, and Huffman codes 257–285 to string lengths from 3 to 258, with a total of 29 length bins of various sizes.

A second Huffman table is employed by PKZIP and LHA to represent the string offsets, once the string length is specified. In other words, after the Huffman code corresponding to a string length (as opposed to a raw byte), a different Huffman code is used to specify the string offset. PKZIP has Huffman codes for 30 offset bins ranging from 1 to 32768, while LHA has 13 offset bins ranging from 1 to 8191. These algorithms are most effective when compressing blocks of data which are 8K bytes or more in size, so that the table overhead as a fraction of block size is minimized.

In these products, the Huffman tables are themselves stored in a compressed form, relying on the well-known fact that, given only the lengths of codes generated by Huffman's algorithm, it is possible to generate and assign a unique set of Huffman codes. Thus, only the lengths of the Huffman codes need to be stored, resulting in a table which is considerably smaller (and more compressible) than the codes themselves. In fact, the Huffman lengths are compressed using Huffman coding, so there is actually an initial (uncompressed) Huffman table which is used to extract the Huffman lengths, which are in turn used to generate the Huffman codes used in compressing and decompressing the data.

Typically, these approaches can compress data to a size that is 10–15% smaller than fixed encoding techniques. Much of the literature and research in data compression has focused more on string search methods than on encoding techniques, but it is clear empirically that considerable gains can be achieved (at a cost in complexity) strictly by concentrating on how encoding is performed. Even ignoring the complexity aspect, however, fixed encoding is still important for many applications where tables cannot be sent. For example, in many communication systems, small packets of data (often less than 100 bytes) must be compressed. The table overhead would be significant in this case. Similarly, in some applications, the data must be compressed and transmitted as it is received, without waiting for an entire block to be received so that a table could be generated.

A major portion of the gain in compression ratio using a variable encoding scheme comes from the variable coding itself, which adapts to the distribution of raw bytes and strings. However, another important component of the gain is attributable to the larger window size (e.g., 8K bytes and above) afforded by the variable coding. Larger windows allow more strings to be found, since more history is available for string searching. For fixed encoding schemes, unfortunately, the increase in the encoded size of offsets tends to negate the fact that more strings are found, while with variable encoding schemes the extra strings will increase the overall compression ratio due to the adaptiveness of the offset encoding.

From an implementation standpoint, one problem with larger window sizes is that the cost of hardware required may be prohibitive, particularly if the entire compression and decompression engines are to be placed on a single integrated circuit. Similarly, software implementations usually require memory size proportional to the window size, and this may be unacceptable in some instances. In any case it is normally desirable to have compatible software and hardware versions of a compression algorithm. The cost and speed of both hardware and software must be taken into account, as well as the compression ratio achievable with the algorithm.

SUMMARY OF THE INVENTION

The present invention relates to a compression/decompression system which increases the capacity of digital storage such as a magnetic disk or tape storage device. The compression method is fully adaptive, requiring no pre-initialized encoding tables, and is optimized for byte-oriented character streams, such as computer files. It overcomes many of the difficulties found in the prior art and achieves higher compression ratios with less memory requirements than any previous technique discussed above.

Compression is achieved first by performing a search on the entire input data stream for prior matching strings of bytes. The string search is performed by maintaining a history array of previously processed bytes. If a matching string is found, an output token is generated indicating the length of the matching string and the offset (relative position) of the matching string within the history array. If no matching string containing the byte currently being examined is found, an output token is generated indicating the "raw" byte.

The compression process is completed by using Huffman-based encoding of the tokens representing matching strings and raw bytes generated by the string searching. A single Huffman encoding tree is used for raw bytes and many of the most common string length/offset pairs. The Huffman table itself is stored in a compressed form as part of the compressed image of the data.

The preferred embodiment of the invention also includes a method for decompressing the encoded data stream which is output from the compression unit. The method for decompression includes the following steps. First, the encoded Huffman length table is received and decoded. Once the length of the code for each Huffman bin is known, Huffman codes are assigned to each token bin. Given the Huffman codes for the token bins, a Huffman tree is built to decode the tokens, which are extracted from the compressed input data stream. If the Huffman bin corresponds to a raw byte, the decompression unit outputs the raw byte. If the Huffman bin corresponds to a string, any extra bits required to specify the string offset and length are extracted from the input data stream. The string is then output, one byte at a time. In the preferred embodiment, as in most sliding window decompression schemes, this is done by keeping a history array of most recent bytes output, and indexing back into the history array by the offset to pull out a byte. All bytes output, either raw bytes or string bytes, are added to the history array.

BRIEF DESCRIPTION OF THE DRAWINGS

FIG. 5a is a flow block diagram of the sliding window search for generating output tokens from the input data stream.

FIG. 9 is a table illustrating an exemplary assignment of token bins in accordance with the present invention.

FIG. 11 depicts an example of the encoding of extra length bits for strings of length 21 and above assigned to a single Huffman bin in accordance with the exemplary Huffman bin assignment of FIG. 9.

FIG. 12 depicts an algorithm for assigning Huffman codes from Huffman lengths.

FIG. 13 depicts the use of run-length coding used to encode Huffman lengths in accordance with the present invention.

FIGS. 14a, 14b, 14c, 14d, 14e and 14f depict the stages of a simplified example of compression encodings according to the present invention.

FIG. 16 depicts a decompression Huffman tree data structure and for decompressing data encoded in accordance with the present invention.

DETAILED DESCRIPTION OF THE PREFERRED EMBODIMENT

Figure 1A:
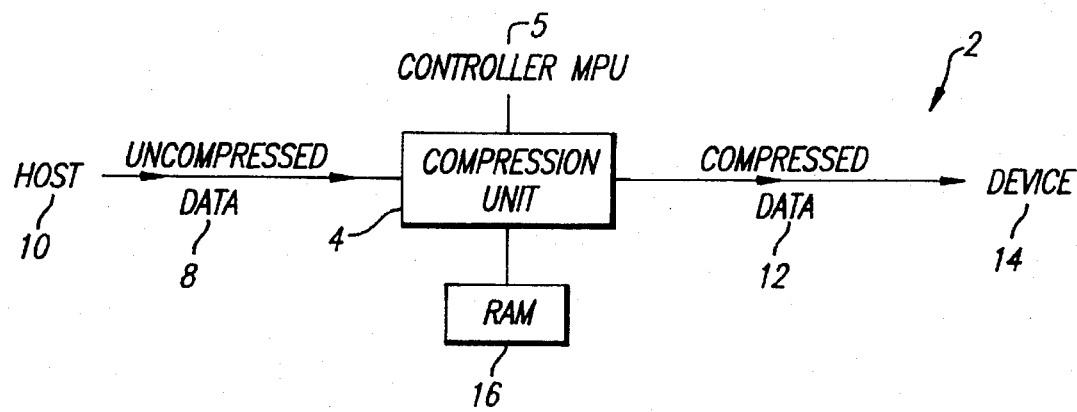
FIG. 1a is a block diagram of a compression unit accepting uncompressed data and outputting compressed data according to the present invention.
Figure 1B:
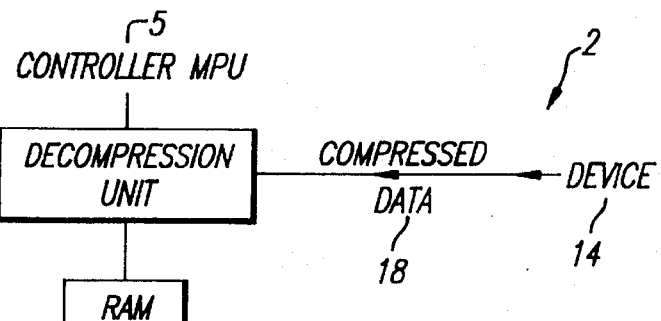
FIG. 1b is a block diagram of a decompression unit accepting compressed data and outputting decompressed data according to the present invention.
Figure 7:
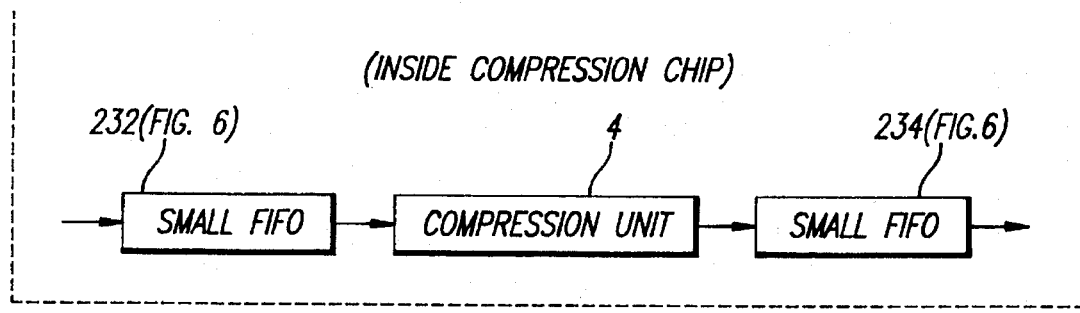
FIG. 7 is a block diagram of the input and output RAM FIFOs.

Referring to FIGS. 1a and 1b a compression unit 4 and a block diagrams of a decompression unit 6 according to the present invention are depicted. Both units 4 and 6 can be hardware modules or software subroutines, but, in the preferred embodiment, the compression 4 and decompression 6 units are incorporated into a single integrated circuit (FIG. 7). The integrated circuit is used as part of a data storage or data transmission system, which is controlled by a microprocessor 5. Referring to FIG. 1a, an input data stream 8 is received by the compression unit 4 from a data source called the host 10, and the encoded compressed data stream 12 is transmitted to a data sink called the device 14.

Similarly, in FIG. 1b, the decompression unit 6 receives a compressed data stream 18 from the device 14 (which in this case is a data source), reconstructs the original uncompressed data stream 20, and outputs it to the host 10 (which in this case is a data sink). In the preferred embodiment, decompression and compression are not performed simultaneously. However, in an alternative embodiment, they could be performed at the same time.

Figure 2:
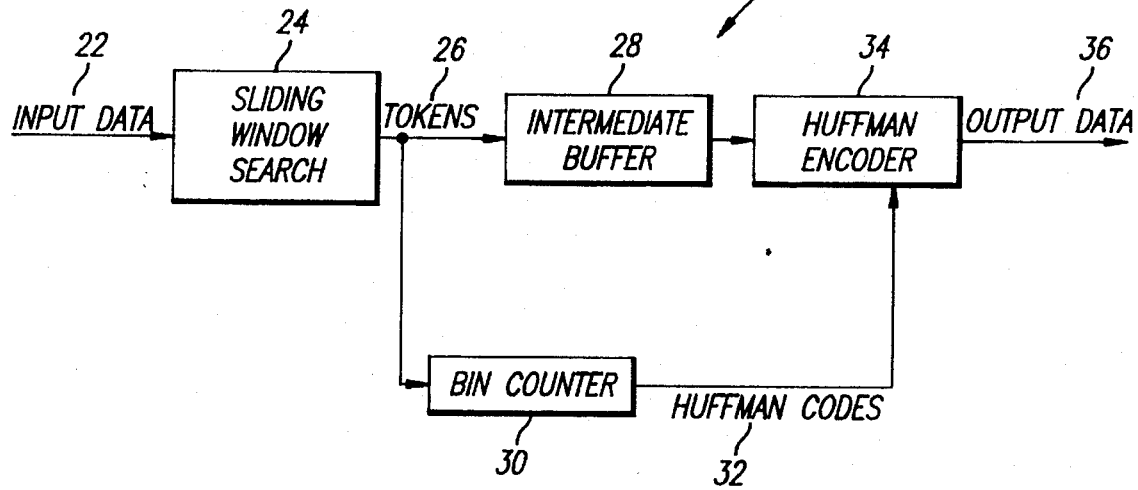
FIG. 2 is a block diagram of a compression unit configured to operate according to the present invention.

Referring now to FIG. 2, a block diagram of the compression unit 4 configured to operate in accordance with the present invention is depicted. Input data 22 is the input data stream to be compressed. The input data 22 is processed using a sliding window string search algorithm, as illustrated at block 24, with a window size of MEMSIZE bytes. Many different string search algorithms may be used at block 24. The output of the sliding window algorithm is a series of tokens 26.

Each of the tokens 26 represents either a raw byte or a matching string with a given length and offset. A raw byte token is produced when no matching string can be found in the preceding MEMSIZE bytes that have been processed. A string token indicates the length of the string match found, as well as its offset in the sliding window. The length and offset are sufficient to allow a decompression unit 6 to reconstruct the original data.

The output tokens are temporarily stored in an intermediate buffer 28 for storage until Huffman codes have been assigned to each of the token bins, which does not take place until after all of the input data 22 has been searched for matching strings and all of the tokens have been generated. As the tokens are produced and stored, they are also assigned into different bins or categories. The bins consist of raw bytes, various string length/offset pairs, and some individual string lengths.

The tokens are also input to a bin counter 30 which counts the number of tokens per bin for all of the tokens generated from the input data 22. The count for each bin is initially set to zero and is incremented by one each time a token corresponding to that bin is produced. In an alternative embodiment, the bin counts are computed only after the sliding window search is complete by re-processing the tokens in the intermediate buffer to accumulate the counts. In another alternative embodiment, the intermediate tokens are stored using a byte-aligned fixed encoding (as opposed to a bit-aligned format), which requires more storage space, but which may be processed more efficiently.

Once all the input data has been processed by the sliding window search 24, with all the output tokens temporarily stored and the bin counts computed, Huffman's algorithm is used to assign Huffman codes 32 to the various bins. The Huffman codes 32 are generated from the bin counts maintained by the bin counter 30. The Huffman probability for each bin is proportional to the bin count, so in general the bins which have larger counts will be assigned shorter codes, and those with smaller counts will be assigned longer codes.

Using a single Huffman tree decreases the size of the table stored with the data. More importantly, combining string length/offset pairs into a single Huffman code means that a string from a given length and offset bin will be much less probable than, for example, a string of a given length independent of offset. Thus, the rounding problems associated with Huffman encoding are minimized, and high compression ratios can be achieved even with a small window size. The small window size leads to more acceptable costs in hardware and software implementation.

In the preferred embodiment, Huffman's algorithm is used only to generate the length of each Huffman code, not the bit code itself. Given the length of the Huffman code for each bin, the actual codes are uniquely generated using the algorithm shown in FIG. 12, discussed below. Only the Huffman code lengths will be stored along with the compressed data, and the decompression unit 6 uses the same algorithm of FIG. 12 to assign the codes, thus guaranteeing consistency between compression and decompression.

The tokens from the intermediate buffer 28 and the Huffman codes 32 are both input to a Huffman encoder 34. The Huffman encoder 34 outputs Huffman code lengths for each bin as the first part of the compressed output data 36. The lengths are output starting with Huffman bin 0, up through the last Huffman bin. The code lengths themselves, which in the preferred embodiment range from 1–15 bits, are output in a compressed format to save space. A zero in the length field means that the given bin had no occurrences. In the preferred embodiment, a simple run-length compression format is used to encode this length table, with each length represented by four bits. In alternative embodiments, the lengths may themselves be encoded using a variable Huffman code, with yet another table placed at the beginning of the data to specify the encoding for the Huffman lengths. This table would be included without being compressed, since there are typically less than 32 codes to include, depending on how (or whether) repeated consecutive lengths (i.e., runs) are included as Huffman codes.

Figures 8, 10:
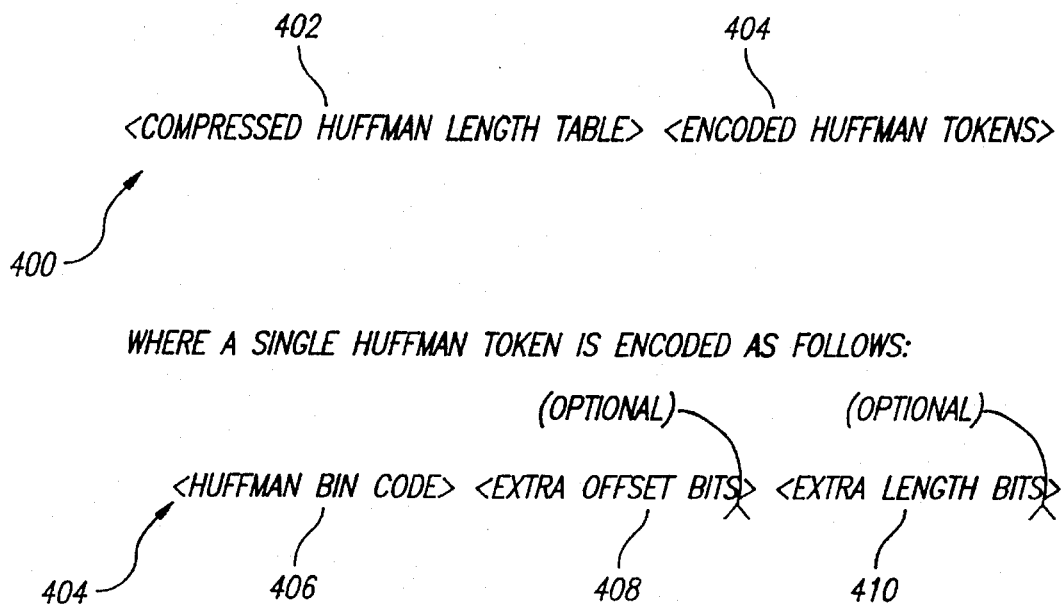
FIG. 8 depicts the compression format used in the present invention.
FIG. 10 depicts an example of the encoding of extra offset bits for strings of length 6 and above in accordance with the exemplary Huffman bin assignment of FIG. 9.

With the Huffman codes assigned and output, the Huffman encoder then processes the tokens in the intermediate buffer 28 and outputs the Huffman codes for each token to the compressed output data stream 36. Most string tokens require extra bits to be appended after the Huffman code. First, any extra bits required to specify the string offset are output. In the preferred embodiment, strings of length 6 and above (Huffman bins 319–334) are followed by a string offset encoding as shown in FIG. 10. Codes for strings of length 3, 4, and 5 (Huffman bins 256–318) are followed by the number of extra offset bits specified in FIG. 11. Next, any extra bits required to specify the string length fully are output. In the preferred embodiment, only Huffman bin 334 requires extra length bits, as shown in FIG. 11. In an alternative embodiment, instead of storing the output tokens in an intermediate buffer, the original input data is again processed by the sliding window search algorithm and the token stream is encoded as it is produced for the second time, based on the Huffman codes generated after the initial sliding window search.

The output of the compression unit 4 is a bit stream. In the preferred embodiment, the bits are output in 16-bit words, with the first bit the most significant bit of the word, and successive bits filling down to the least significant bit of the word. Once a word is filled, it is output, least significant byte first, and a new word is accumulated, starting again with the most significant bit of the word. Once all the tokens are encoded and output, a special Huffman code (335 in the preferred embodiment) is output to signify the end of compressed data, and pad bits are output to fill up the remainder of the output word. The final code will be used to stop the decompression unit 6. In alternative embodiments, the bits may be output in 8-bit bytes, or the bits may be accumulated starting with the least significant bit, or the word may be output with the most significant byte first.

Figure 3:
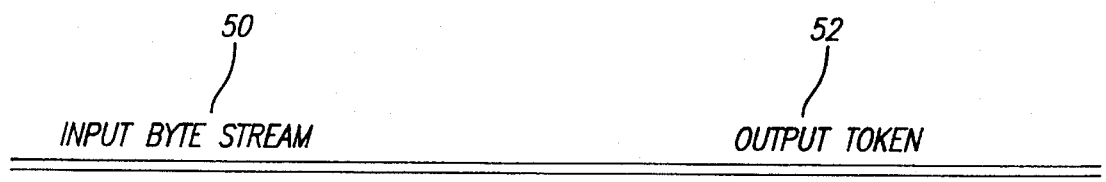
FIG. 3 is an example of the generation of output tokens according to the present invention.

FIG. 3 is a simple results table containing an example of the generation of tokens by the sliding window search block 24 is depicted. The table is divided into two columns, the first column 50 representing an input data stream and the second column 52 representing the output stream of tokens and raw data. The minimum matching string length necessary to generate a token is 3 bytes in the preferred embodiment because it empirically seems to give the best results.

The second column 52 is referenced by rows 60–70. The first input byte is the character "A," which has not appeared before and, thus, has an output token corresponding to a raw byte "A" (row 60). The next input byte is the character "B," which has also not appeared before (the sliding window history only has "A") and, thus, has an output token corresponding to a raw byte "B" (row 62). The next input byte is the character "A." Because in the preferred embodiment only strings having three or more are encoded as matching strings, the character "A" is output as a raw byte "A" (row 64). However, when the next "A" characters occur, a matching string is found which, after all of the "A" characters have been processed, has length 5 at an offset of 1. A corresponding token (row 66) is therefore generated. The next input byte is a "C," which has not appeared before and, thus, has an output token corresponding to a raw byte "C" (row 68). The next three bytes "ABA" match the string at the beginning of the input data stream. Therefore, a token is output for this matching string indicating a match of a string of length 3 at offset 9 (row 70).

All data structures (e.g., history array 102, hash table 100, and offset array 104 (FIG. 4)) are maintained in RAM 16, which can comprise a single or multiple RAM units. A more detailed explanation of the preferred data structures implemented by the preferred embodiment is discussed below during the discussion of the compression unit 4 that builds and maintains them.

Those skilled in the art shall recognize that the values of all numeric parameters (e.g., MEMSIZE, 16-bit HPTR size, etc.) discussed below can be modified without affecting the basic concept behind the compression decompression technique of the present invention.

In the above example, if a byte did not match, then the sliding window search 24 would have continued to search back through the history array of the input byte stream for a string that matched up to and included the current input byte. If such a new string was found, the match length would be incremented and the position of the new matching string would be determined and saved; this string match has thus been "extended". If such a new string is not found, or if too many prior input byte entries have to be searched, the current matching string is assumed to be the maximal string and in its encoded token is output. The encoded token includes its length and relative position within the history storing the input byte stream. The offset is computed as the number of bytes from the start of the string to the matched byte in the buffer, which ranges in the preferred embodiment from 1 to the memory size (MEMSIZE - 1).

A hashing technique is used in the preferred embodiment to perform an efficient string search. Those skilled in the art will recognize that there are many implementations for performing string search operations on the input byte stream. In particular, there are many hashing techniques and search methods that could be used to find matching strings. For a complete background on various hashing techniques, refer to Knuth, Sorting and Searching, The Art of Computer Programming (Vol. 3) pp. 506–549 (1973), which is herein incorporated by reference. Below is a more detailed description of the particular hashing structure utilized by the preferred embodiment. The data structures and approach to be discussed have been selected because they minimize the number of RAM-cycles required for the string search function, thus maximizing the system throughput.

Figure 4:
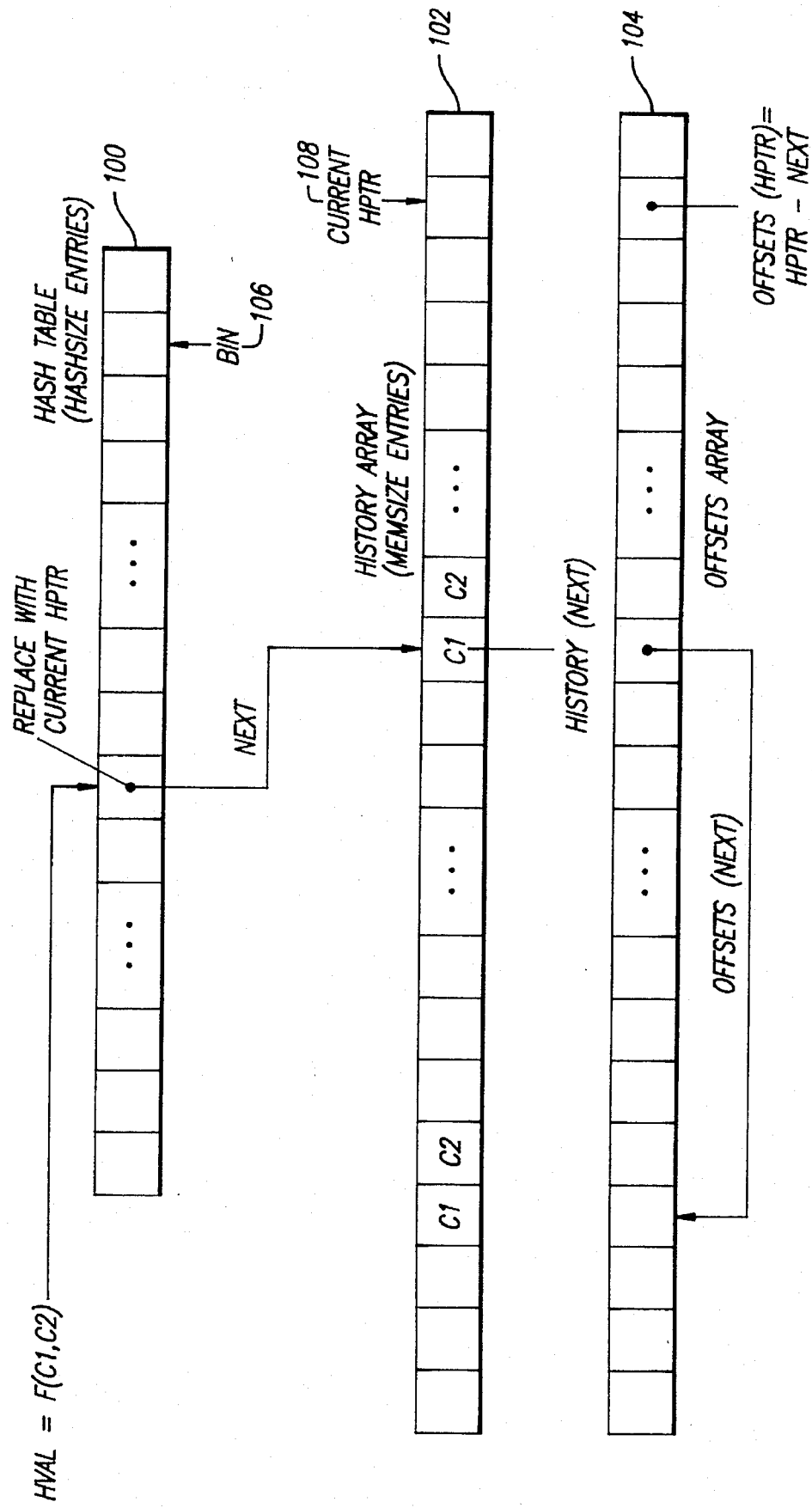
FIG. 4 shows the data structures implemented by the preferred embodiment of the invention for performing searches for matching strings on the input data stream.

Referring now to FIG. 4, the preferred embodiment of the hash structure is now discussed. A history array 102 containing the last MEMSIZE (preferably 2048) characters of previously processed input data (which has already been compressed or which is uncompressed as raw data) is stored in RAM 16 (FIG. 1a). When new input data is received by the sliding window search 24, the present invention first checks to see if a "string" of at least 2 bytes in the new input data matches the string in the history array 102. If so, the search is extended to find a matching string of at least a length of 3 bytes. If a matching string of at least a length of 3 bytes is found, a token representing the matching string is output. If no matching string of at least a length of 3 bytes is found, then a raw data token representing the currently processed byte is output.

A hash table 100 is utilized to quickly find specified strings in the history array 102. The hash table 100 is made up of a series of entries which contain history array pointers into the history array 102. Another data structure called the offset array 104 is a hash link table. The first item in each linked list in the offset array 104 points to the previous entry in the history array 102, which corresponds to a particular hash value, and the last item (which may be an invalid pointer) in the linked list points to the oldest entry associated with this hash value. The sliding window search 24 maintains a 16-bit history pointer HPTR 108 which is incremented after each input byte is processed. HPTR 108 is initialized to 0. In the preferred embodiment, the compression operation is never performed on blocks larger than 64K in size. Therefore, HPTR 108 does not need to "wrap" back to 0 after 64K bytes have been processed by the sliding window search 24. Since HPTR 108 does not wrap, it is not necessary to remove old entries from the hash table which have become invalid by the "wrapping" of HPTR 108. The offset array 104 is actually a secondary hash which consists of a singly linked list. If a particular offset is greater than MEMSIZE-MAXSTR (where MAXSTR is the maximum string being searched) or if the sum of all the links from the most recent entry of the list is greater than MEMSIZE-MAXSTR, then there are no further valid entries in the particular hash entry (value). In this way, the entries older than MEMSIZE–MAXSTR effectively "fall off" the end of the history array 102. This aspect of the present invention allows use of a singly linked list in the offset array 104, which can be maintained with less than half the memory accesses compared to a doubly linked list.

Figure 5B:
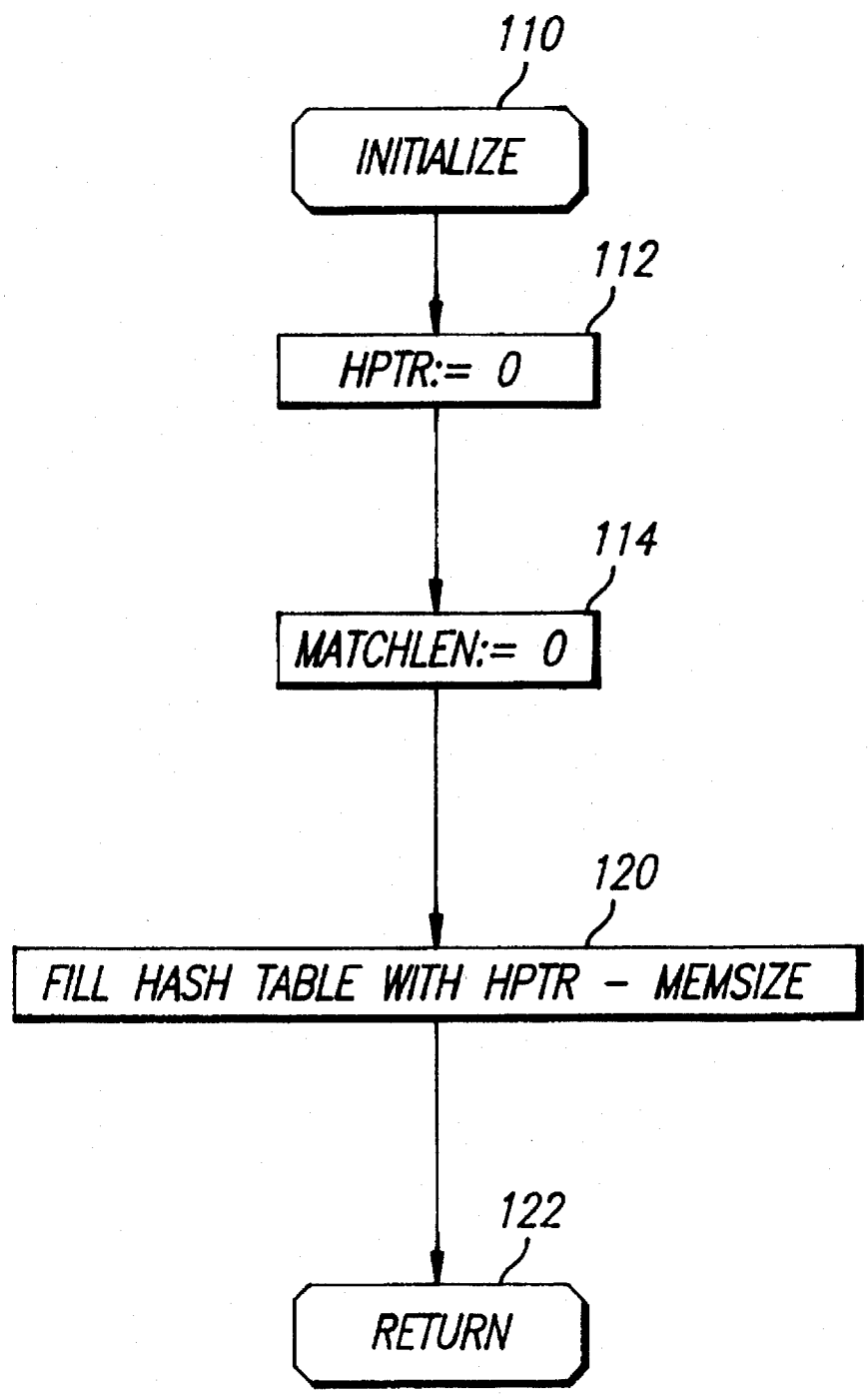
FIG. 5b is a flow block diagram of the INITIALIZE routine referenced during the sliding window search (FIG. 5a) for initializing the hash table of the data structures shown in FIG. 4.
Figure 6:
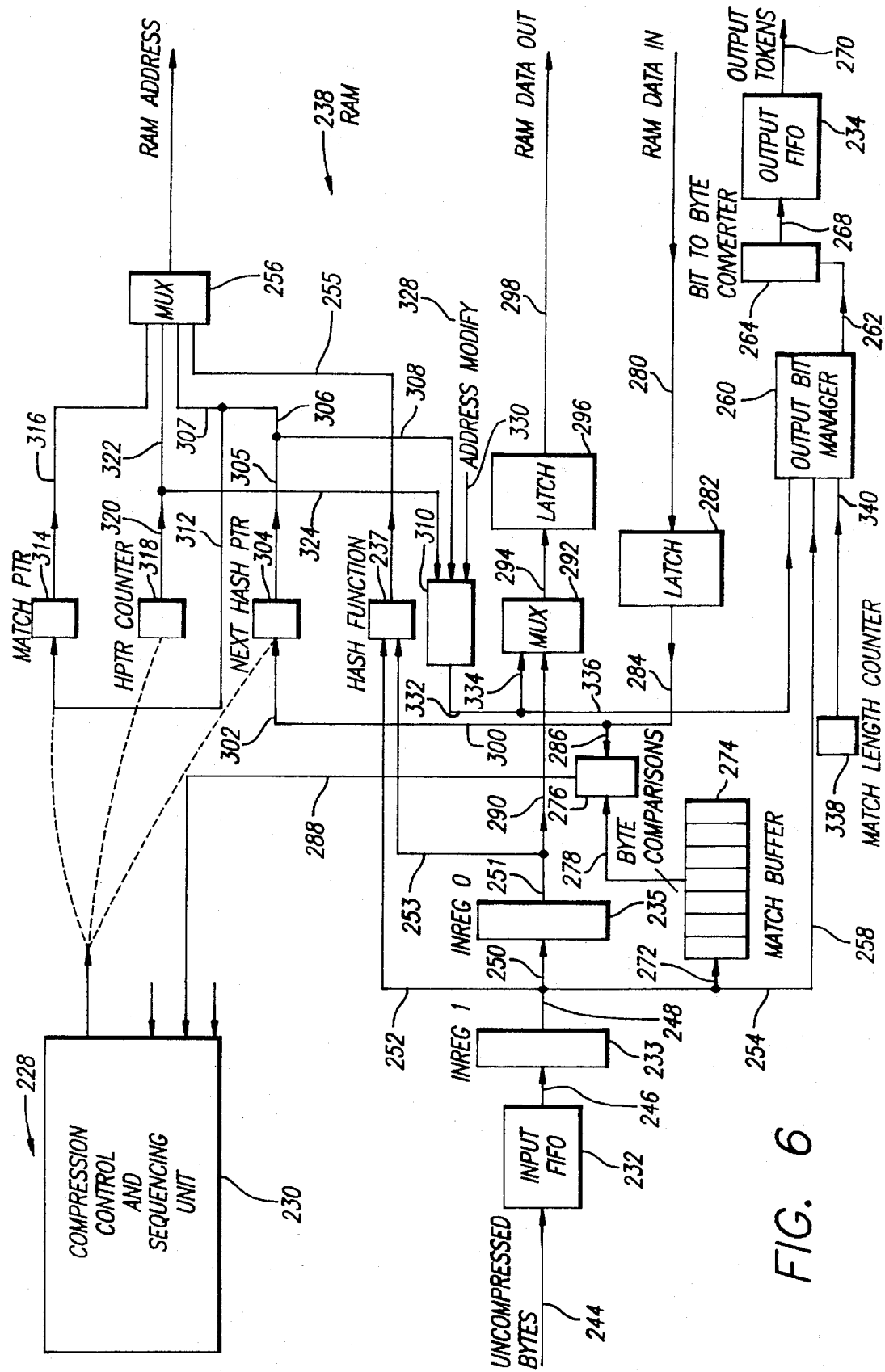
FIG. 6 is a schematic block diagram of a hardwired representation of the sliding window search and output token generation of the present invention.

Referring now to FIGS. 5a and 5b, a detailed flow diagram of the sliding window search of the present invention is now discussed. A hard-wired version showing the particular data path of the flow diagram (FIGS. 5a and 5b) is shown in FIG. 6.

More particularly, referring to FIG. 5a, the sliding window search routine starts at block 109. Then, at block 110, the INITIALIZE Routine (FIG. 5b) is called to initialize the hash structure shown in FIG. 4. This operation is performed at the beginning of each new window search operation.

Referring to FIG. 5b at block 112, the hash pointer 108 (HPTR) is set equal to 0. At block 114 (FIG. 5b), a match length variable ("MATCHLEN") for keeping track of the current length of the presently encoded bit string is set to 0. Then, during block 120, the hash table 100 is filled with the value HPTR–MEMSIZE. This step effectively empties the hash table 100 of all prior valid values.

Referring back to FIG. 5a, after the INITIALIZE Routine (FIG. 5b) has been completed, the sliding window search can begin to accept bytes from the incoming data stream. During block 128, the first two bytes of the history array 102 are filled with input data in order to initialize the operation. The two bytes are held in registers INREG0 and INREG1. Each time a new byte is processed, the hash ("H") of the first byte and the next input byte are computed. In the preferred embodiment, the hash is computed by shifting INREG0 left 4 bits and XORing it with INREG1. As discussed above, any of the hashing functions as discussed by Knuth (reference above) would be acceptable. As each new incoming byte is processed, the contents of INREG1 is moved to INREG0 and INREG1 is loaded with the new byte value.

For each byte processed at block 128, the hash value H ("H") is computed and the old entry within the hash list corresponding to the new hash value is read and saved in a variable called NEXT. Also, at block 128, the old entry in the hash table bin corresponding to the current hash value is replaced by the current value for HPTR. At block 140, a determination is made as to whether HPTR–NEXT≧= MEMSIZE–MAXSTR is made. The variable MAXSTR is the value of the maximum string size being searched which ensures that the matching string of bytes found in the history array 102 is not overwritten by the currently processed bytes. Assuming that the determination results in a value greater than or equal to MEMSIZE–MAXSTR, then processing continues at block 142, during which the variable NEXT is set equal to HPTR–MEMSIZE. Stated differently, the hash bin is emptied because there were no matching strings within the last MEMSIZE bytes of history.

Regardless of whether the determination results in the value greater than or equal to MEMSIZE–MAXSTR, processing continues at block 144. During block 144, the value HPTR–NEXT is written into the corresponding offset array 104 entry at OFFSET(HPTR). Also, at block 144, the value of INREG1 is placed into the history array 102 entry at HISTORY(HPTR). The steps performed at blocks 128, 140, 142 and 144 discussed above complete the data structure maintenance required for the currently processed byte, and at this point a string search of the contents of history array 102 can begin. Note that the above housekeeping functions are performed for all input bytes processed, regardless of whether the sliding window search is currently processing a string match. In an alternate embodiment, some of the housekeeping functions are only performed for some of the input bytes processed in order to increase throughput of the operation at a slight cost in compression ratio.

At block 146, a determination is made as to whether the match length variable MATCHLEN is equal to 0. Recall that at block 114 of the INITIALIZE Routine (FIG. 5b) the MATCHLEN variable was set equal to 0. MATCHLEN contains the current string match length which, at the beginning of the operation, is 0. Assuming that we are processing at the beginning of the compression operation and that MATCHLEN is equal to 0, then an internal hash counter HASHCNT is set to 0. HASHCNT is used to limit the iterations of any particular string search. Then, at block 150, a determination is made as to whether HPTR–NEXT>= MEMSIZE–MAXSTR. Assuming that the resulting value is less than MEMSIZE–MAXSTR, processing continues at block 152. During block 152, a determination is made as to whether the value for the variable INREG1 is equal to the value in the history array at HISTORY(NEXT). The purpose of this step is to search to the prior entry in the history array for a 2-byte string that matches the 2 bytes in INREG0 and INREG1. Only the value within INREG1 is compared to the value at HISTORY(NEXT) because the hash function is chosen to be a 1 to 1 mapping with respect to INREG0, so that only one byte from each string in the hash list has to be compared with INREG1. This step increases the performance of the present embodiment because a 1-byte comparison instead of a 2-byte comparison only needs to be performed. Returning to block 150, if the value determined is greater than or equal to MEMSIZE–MAXSTR, then processing continues at block 158. During block 158, a raw data byte token representing the byte in INREG0 is output and processing continues to block 125. At block 125 the next input byte is obtained and the process starts all over again.

Returning to block 152, if the determination results in a match, then processing continues at block 160 during which the variable MATCHPTR is set equal to the value of the variable NEXT. Additionally, the variable MATCHLEN is set equal to 2 to signify a two byte match and the contents of INREG0 are saved into a variable OLDRAW in case there is eventually no matching string greater than length 2. Processing continues at block 125 during which the next input byte is obtained. However, assuming that the value at HISTORY(NEXT) is not matched, then processing continues at block 154 during which the value of HASHCNT is incremented and the variable NEXT is set equal to NEXT–OFFSET(NEXT). This step effectively points to the next entry linked by the offset array 104. Processing continues at block 156 during which a determination is made as to whether HASHCNT reaches a predetermined maximum count value MAXHCNT (typically 8). If HASHCNT is greater than or equal to MAXHCNT, then processing continues at block 158 during which the output raw byte token for INREG0 is output and processing continues at block 125. However, if HASHCNT is not greater than or equal to MAXHCNT, then processing continues at block 150, 152, 154 and 156 until HASHCNT reaches MAXHCNT (or 8 in the preferred embodiment) or until there are no more valid entries in the hash list (as determined at block 150) or until a matching string is found (at block 152).

Eventually, processing continues at block 125, and at this time, the sliding window search is ready to process a new input data byte. At block 125, HPTR is incremented. Processing continues at blocks 128, 140, 142, 144, 146, 148, 150, 152, 154, 156, 158, 160 and 125 until MATCHLEN is determined to be greater than 0 at block 146. Referring to block 146, note that when MATCHLEN is not equal to 0, processing continues at block 162. During block 162, the variable MATCHPTR is incremented by 1. In this way, the new value INREG1 will be compared against the next byte in the stream of MATCHLEN plus 1 found at MATCHPTR in the history array 102. At block 164, the determination is made on whether the bytes match. If the bytes match, then MATCHLEN is incremented and the string is extended at block 180 and processing then continues at block 125. However, if the bytes do not match, then processing continues at block 166 during which the variable NEXT is set equal to MATCHPTR−MATCHLEN+1. Processing continues at block 168, during which the variable NEXT is set equal to NEXT−OFFSET(NEXT). In addition, at block 168, the variable HASHCNT is incremented. Steps 166 and 168 effectively cause the sliding window search to search to the successive string entry remaining in the hash list for the original string being matched. At block 170, a determination is made on whether HPTR−NEXT≧=MEMSIZE−MAXSTR. If the value determined is greater than MEMSIZE − MAXSTR, then there are no more valid entries and processing continues at block 124. At block 124, a determination is made as to whether MATCHLEN is greater than 2. If not, then processing continues at block 126 where an output token representing the raw data byte in the variable OLDRAW is output. Then, NEXT is replaced with the hash list corresponding to the latest hash value of INREG1 and INREG0. Then, MATCHLEN is reset to 0 and processing resumes at block 148.

If MATCHLEN is greater than 2 at block 124, then processing continues at block 182, where the sliding window search 24 outputs a token representing the length of the matching string (MATCHLEN) and its offset (OFFSET= HPTR−MATCHPTR) within the history array 102. Processing continues at block 184, where MATCHLEN is set to 0 and processing begins over with a new byte at block 125.

However, if the value determined at block 170 is less than MEMSIZE−MAXSTR, then processing continues at block 172 during which a determination as to whether MATCHLEN≧=MAXSTR is made. Assuming that MATCHLEN>=MAXSTR, then the search limit has been reached and processing continues at block 124. However, assuming that MATCHLEN is not greater than or equal to MAXSTR, then processing continues at block 174.

At block 174, a determination is made as to whether the current string of MATCHLEN+1 at location HISTORY (NEXT) is equal to the contents of the internal match buffer. The internal match buffer contains all MATCHLEN bytes of the currently matching string. This buffer allows faster searching for a new string if the initial attempt to match this string fails. An efficiency occurs because the bytes to be matched are immediately available within the chip instead of having to reach them from RAM each time a match is performed. Stated differently, the matching buffer acts as a look aside buffer to efficiently enhance processing. The match buffer is of finite length (MAXSTR =8 bytes in the preferred embodiment).

If the string of MATCHLEN+1 at HISTORY (NEXT) equals the contents of the match buffer, then processing continues at block 178 during which the variable MATCHPTR is set equal to NEXT+MATCHLEN. Processing continues at block 180 during which MATCHLEN is incremented and processing continues at block 125 during which the next new byte in the input data stream is processed. However, if the string at HISTORY (NEXT) is not equal to match buffer, then processing continues at block 176, during which a determination is made as to whether the variable HASHCNT is greater than or equal to MAXHCNT. If HASHCNT is greater than or equal to MAXHCNT, then processing continues at blocks 182 and 184 during which a matching string token is output containing the length and offset of the match in the history array, and the variable MATCHLEN is set equal to 0. Processing continues at block 125 during which the next new input data byte is processed. Returning to block 176, however, if HASHCNT is not greater than or equal to MAXHCNT, then processing continues at blocks 168, 170, 172, 174 and 176 until a match length of MATCHLEN+1 is found, or until HASHCNT reaches MAXHCNT or until there are no more valid hash entries (HPTR−NEXT≧=MEMSIZE−MAXSTR).

In the preferred embodiment, the above operations are pipelined to ensure that the RAM 16 (FIG. 1a) is busy on every clock cycle, since the RAM cycle count is the limiting factor on performance.

Typically, in a storage system, the data must be blocked into sectors or blocks of a fixed size, and it is often desirable to truncate the compression at a given stage and then restart a new operation on the remaining input stream. The compression unit 4 then outputs a special "end of compressed data" token, discussed below.

Extensive software simulation of the compression method was performed during the development of the present invention. Various values of all the parameters, including MAXHCNT, HASHSIZE, match buffer size and MEMSIZE, were tested to determine their impact on throughput and compression ratio. The particular format and set of parameters in the preferred embodiment was selected as having an acceptance tradeoff on these performance issues. However, many similar sets of parameters and encodings result in substantially similar performance.

Referring to FIG. 6, a circuit diagram 228 which incorporates the preferred embodiment of the sliding window search 24 (FIG. 2) and generation of output tokens is shown. The elements of circuit 228 are implemented by digital logic. Circuit 228 is controlled by compression controller and sequence unit 230. Compression control and sequence unit 230 is linked to each of the components of circuit 228 by a series of control lines not shown. An internal clock (not shown), which in the preferred embodiment operates at several megahertz/second, determines the activity level of the control and sequencing unit 228, which may affect the operation of one or more of the components during any clock cycle of operation. The actual operations and their sequence are depicted in FIGS. 5a and 5b, which were discussed earlier.

A more detailed discussion of the data flow within the circuit 228 is now presented. Uncompressed bytes in an input byte stream are input into the compression unit 4 over line 244 to the input FIFO 232. Bytes stored in the input FIFO are then transferred to two extension FIFO registers INREG1 233 and INREG0 235. More particularly, the data from FIFO 232 is linked to the INREG1 register 233 over line 246. The data stored in INREG1 233 can then be transferred via lines 248 and 250 to INREG0 235. Recall that the purpose of the INREG1 and INREG0 registers were for producing the input to the hashing function (237). The contents of INREG1 233 is output via line 248 to line 252 and input to the hash function 237. Likewise, the contents of INREG0 235 is output over line 251 and then over line 253 to the hash function 237. The output of the hash function 237 is sent via line 255 to the multiplexer 256.

Returning to INREG1 233, if no matching string is found, then it will be sent over lines 248, 254, and 258 to the output manager 260. The purpose of the output manager 260 is for generating output tokens of raw data bytes and matching strings. The output of the output manager 260 is then sent via line 262 to a bit to byte converter 264. Then the data is input to the output FIFO 234 via line 268. The output tokens are output from the output FIFO 234 via line 270 to the intermediate buffer (28, FIG. 2).

The contents of INREG1 233 are also sent via lines 248, 254 and 272 to internal match buffer 274. The purpose of the internal match buffer 274 is for acting as a "lookaside" buffer to efficiently enhance the matching process. The contents of the match buffer 274 are then compared to the contents at the byte comparison register 276. The contents of the match buffer are multiplexed over line 278 to the byte comparison register 276. The contents of the byte comparison register 276 are obtained from the history array 102 (FIG. 4) stored out in RAM 238. The contents of the history array entry are input via line 280 to latch 282 and then over lines 284 and 286 to the byte comparison register 276. The results of the byte comparisons performed at block 276 are sent via line 288 to the control and sequence unit 230. The control and sequence unit 230 evaluates the comparison results and sends out the appropriate control signals to the various components of the circuit 228 via control lines (not shown).

Returning to INREG0 235, its contents can also be sent via lines 251 and 290 to multiplexer 292. Multiplexer 292 then arbitrates and sends the contents of INREG0 via line 294 to latch 296. The contents of latch 296 are then output via line 298 to the history array 102 (FIG. 4) of the data structure in the RAM 238.

Data input from the RAM 238 over line 280 may also be sent via latch 282 and lines 284, 300 and 302 to register 304. Data over this path would consist of an old hash pointer stored in a variable called NEXT. The contents of register 304 can then be output via lines 305, 306 and 307 to multiplexer 256. The output of register 304 is also tied to an offset register 310 via lines 305 and 308. The operation the function performed at 310 will be discussed shortly. The contents of register 304 may also be sent via lines 304, 305, 306 and 312 to register 314 containing the variable contents for MATCHPTR. The output of register 314 (MATCHPTR) is sent via line 316 to multiplexer 256. The purpose of register 318 is for incrementing the pointer HPTR. The output of register 318 is sent via lines 320 and 322 to the multiplexer 256. In the alternative, the output of register 318 may also be sent via lines 320 and 324 to the offset register 310. The purpose of the offset function is for calculating the appropriate offset in the history array or HPTR–NEXT as input over lines 324 and 308 from the registers 318 and 304.

A modify switch 328 may be applied over line 330 to the offset register 310 to force the offset function to only output the current HPTR input over line 324. When the modified switch 328 is set such that the offset function is determined, the output of offset function 310 is sent either to multiplexer 292 or to the output manager 260. When the output is sent to the output manager 260 it is sent via lines 332 and 336. The offset is then encoded into the encoded string at the output manager 260. Alternatively, the output is sent to multiplexer 292 via lines 332 and 334 and then output over lines 294 to latch 296 and to the RAM 238 via line 298. However, if the modify switch 328 is set such that the output of the offset register 310 is the current HPTR, then the output is sent via lines 332 and 334 to multiplexer 292 which arbitrates the output over line 294.

The length input to the output manager 260 for encoding purposes is maintained by register 338 shown at the bottom of the circuit diagram 228. The output of the register 338 is linked to the output manager 260 via line 340. The purpose of multiplexer 256 is for arbitrating which address over lines 316, 322, 307 and 255 is output in order to select the appropriate data structures in the RAM 238.

Referring now to FIG. 7, the use of input and output FIFOs is displayed. The input FIFO 232 (FIG. 6) and output FIFO 234 (FIG. 6) are shown on the input and output sides of the compression unit 4. The input and output FIFOs are preferably within the same chip as both the compression unit 4 and decompression unit 6.

Referring now to FIG. 8, the compressed data output format of the present invention is illustrated at 400. The compressed data output format 400 consists of a compressed Huffman length table 402 and encoded Huffman tokens 404. The encoded Huffman tokens 404 represent raw data bytes or matching strings according to the Huffman length table. Each encoded Huffman token 404, also illustrated in FIG. 8, contains a Huffman bin code 406. If the Huffman bin code 406 indicates a matching string having more than one possible offset, then the encoded Huffman token 404 will also contain extra offset bits 408 to indicate the exact offset of the string for the particular Huffman bin code 406. Similarly, if the Huffman bin code 406 indicates a matching string having more than one possible length, then the encoded Huffman token 404 will also contain extra length bits 410 to indicate the exact length of the string for the particular Huffman bin code 406.

For most data, it is empirically found that the majority of strings are of length 3, 4, or 5. For this reason, in the preferred embodiment, these string lengths are split into multiple Huffman bins to allow better matching of Huffman codes to the offset distribution. Without pairing the length and offset of these strings in the Huffman bins, the Huffman rounding error for strings would become more significant. For example, the token probability for strings of these lengths (ignoring offset) would often lead to Huffman codes with lengths in the range 2–5 bits. By splitting these bins based on length and offset, the Huffman length for these bins is typically in the range 6–10 bits. The extra coding efficiency gained by this bin splitting allows good compression ratio to be achieved even with a window size of only 2K bytes. Alternately, using a larger window, a slightly higher compression ratio could be achieved using the combined length/offset pairs than without the combined bins.

FIG. 9 is a table illustrating an exemplary assignment of token bins according to the present invention. Column 450 indicates Huffman bin numbers, column 452 indicates the description of what is represented by each bin, and column 454 indicates the number of extra offset bits, if any, required to specify the exact offset within the range of offsets represented by each bin. For example, row 462 indicates that Huffman bins 0 through 255 represent raw bytes having codes 0 through 255. Raw byte codes can be determined from an ASCII or any other similar coding scheme. Since raw bytes are not matching strings, no extra offset bits are required for Huffman bins 0 through 255. As another example, row 464 indicates that Huffman bins 256 through 258 represent matching strings of length 3, 4 and 5, respectively, having an offset of 1. Since only one offset value is represented by each of Huffman bins 256 through 258, no extra offset bits are required for those bins. As a further example, row 466 indicates that Huffman bins 295–297 represent matching strings of length 3, 4 and 5, respectively, having offset values in the range 128 through 191. In order to specify which of the 64 offset values within the range 128 through 191 are represented by a given output token, 6 extra offset bits are required.

As a still further example, row 468 indicates that Huffman bins 319 through 333 represent matching strings of lengths 6 through 20, respectively. The extra offset bits required to specify the offset for matching strings having length 6 or greater are shown in FIG. 10, discussed below. As a still further example, row 470 indicates that Huffman bin 334 represents strings of length 21 or greater. Because this bin represents strings of more than a single specific length, extra length bits are required to specify the specific length represented by the token containing this bin. The extra length bits required to specify the length of matching strings in this bin are shown in FIG. 11, discussed below. The extra offset bits required to specify the offset for matching strings having length 6 or greater are shown in FIG. 10, discussed below. As a last example, row 472 indicates that Huffman bin 335 represents the end of compressed data marker. Obviously, no extra offset bits are required.

Those skilled in the art will recognize that the values of all parameters (e.g., MEMSIZE, the particular bin assignments, etc.) discussed herein can be modified without affecting the basic compression technique.

In the preferred embodiment, all strings of length six and above use the fixed offset encoding shown in FIG. 10. In alternative embodiments, strings of length 6 and above may also have bins with combined string length and offset range, similar to that used for strings of length 3, 4 and 5 in the preferred embodiment. However, it was found empirically that, since most strings are of length 5 and below, the extra space required to store the additional Huffman table entries was comparable to the gains due to better coding on the longer strings, so such embodiments produced very modest gains in compression ratio. Similarly, using a minimum string length of 2 bytes in alternative embodiments, little or no compression ratio gain was observed empirically, probably because the Huffman on raw bytes typically encodes strings of length two as well as a string encoding does.

As indicated at 502 in FIG. 10, offsets in the range 1 through 32 are represented by extra offset bits consisting of two bits "00" followed by 5 bits. As indicated at 504, offsets in the range 33 through 160 are represented by extra offset bits consisting of two bits "01" followed by 7 bits. As indicated at 506, offsets in the range 161 through 672 are represented by extra offset bits consisting of two bits "10" followed by 9 bits. As indicated at 508, offsets in the range 673 through 2047 are represented by extra offset bits consisting of two bits "11" followed by 11 bits.

Referring now to FIG. 11, an exemplary assignment of extra length bits used to represent the length of strings of length 21 and above is depicted in a table. The column at 520 indicates the possible string lengths and the column at 522 indicates the corresponding extra length bits used to specify the given length.

Referring now to FIG. 12, an algorithm for assigning Huffman codes from Huffman lengths is depicted in the C programming language. At 540, the variables passed to the exemplary subroutine are defined. The variable "lengths" is an array of lengths for each code. The variable "codes" is an array of the assigned Huffman codes to be generated by the subroutine, which can be up to 32 bits each. The variable "size" is an integer representing the number of entries in the "lengths" array. At 542, the frequency counts for the subroutine are initialized. At 544, the frequency of each length is counted. At 546, base codes are assigned. At 548, the actual Huffman codes are assigned to the bins.

Referring now to FIG. 13, the use of run-length coding used to encode the Huffman length table in accordance with the present invention is depicted. The length table 570 contains various segments 572. A segment 572 contains a zero count 574, a nonzero count 576 and nonzero lengths 580. Both the zero count 574 and the nonzero count 576 separately contain a count 578. The count 578 represents the count of zeroes or nonzeroes. The count 578 is encoded as indicated in FIG. 13. A count of "0000" represents the end of the entire table. Counts "0001" through "1110" represent counts of 1 through 14, respectively. Counts of 15 through 270 are represented by a count consisting of "1111" followed by eight bits. Nonzero lengths 580 are encoded as indicated in FIG. 13. A nonzero length of "0000" indicates the end of the entire table. Nonzero lengths "0001" through "1111" represent nonzero lengths of 1 through 15, respectively.

An example of the coding of the table is shown at 582. All quantities shown in the example are 4-bit nibbles. An exemplary length table 584 contains the following lengths to be encoded: 0, 0, 0, 0, 8, 9, 1, 0, 5, 4, 0, 0, 0. The first segment of the table is 4, 3, 8, 9, 1, representing four zeroes, three nonzeroes, and the three nonzero lengths 8, 9, 1. The second segment of the table is 1, 2, 5, 4, representing one zero, two nonzeroes, and the two nonzeroes 5, 4. The last segment of the table is 3,0, representing three zeroes and then the end of the table.

Referring now to FIGS. 14a, 14b, 14c, 14d, 14e and 14f, the stages of a simplified, but complete example of the output of the compression unit 4 for a small input stream, using the encoding method of the preferred embodiment, is depicted. In this case, because the size of the input stream is so small for purposes of illustration, the output data stream is actually larger than the input data stream. However, the example serves to illustrate exactly how the compression encoding steps are performed.

In FIG. 14a, the example is shown to be the phrase of ASCII text "this is a small small example". At column 600, the tokens generated by the sliding window search are listed. At column 602, the Huffman bins corresponding to each of the tokens are listed in accordance with the Huffman bins assignment depicted in FIG. 9.

In FIG. 14b, column 610 lists the Huffman bins used in numerical order. Column 612 lists the bin count for each bin in column 610. Column 614 lists the Huffman lengths for each bin in column 610. Column 616 lists the assigned Huffman code for each bin in column 610.

In FIG. 14c, the compressed Huffman table is depicted, where all quantities represent hexadecimal nibbles. The segments of the compressed table are listed in column 620. The corresponding description of each table segment is located in column 622.

In FIG. 14d, the bit stream of the encoded tokens is depicted in column 630. The corresponding unencoded tokens are listed in column 632.

Figures 14E, 14F, 16:
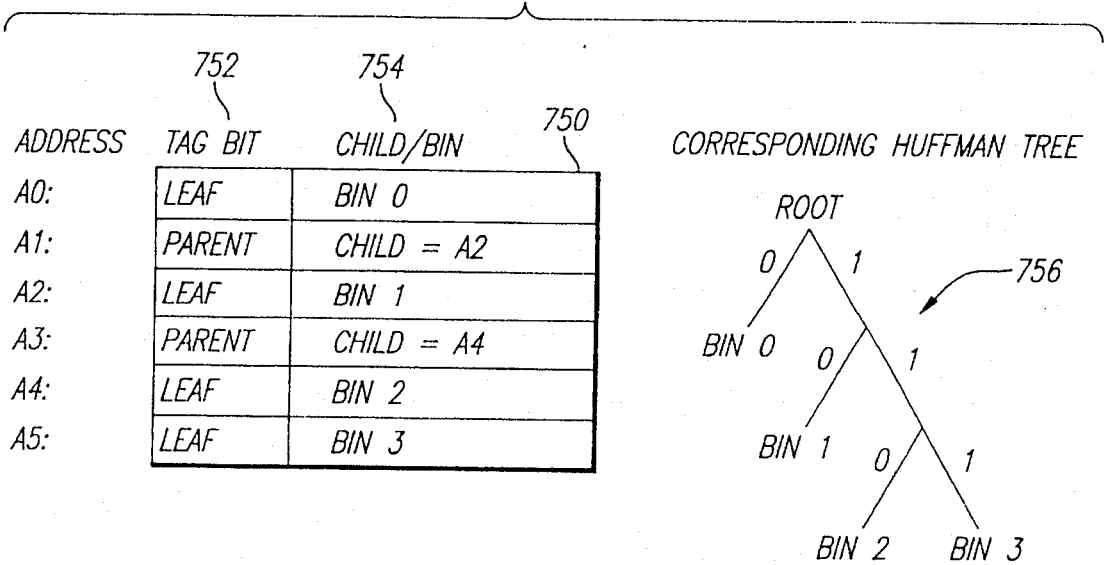

In FIG. 14e, the output byte stream 640, consisting of the table and encoded tokens, is depicted. In FIG. 14f, the output word stream 642, consisting of the output byte stream 640 put into output words, is depicted.

Figure 15:
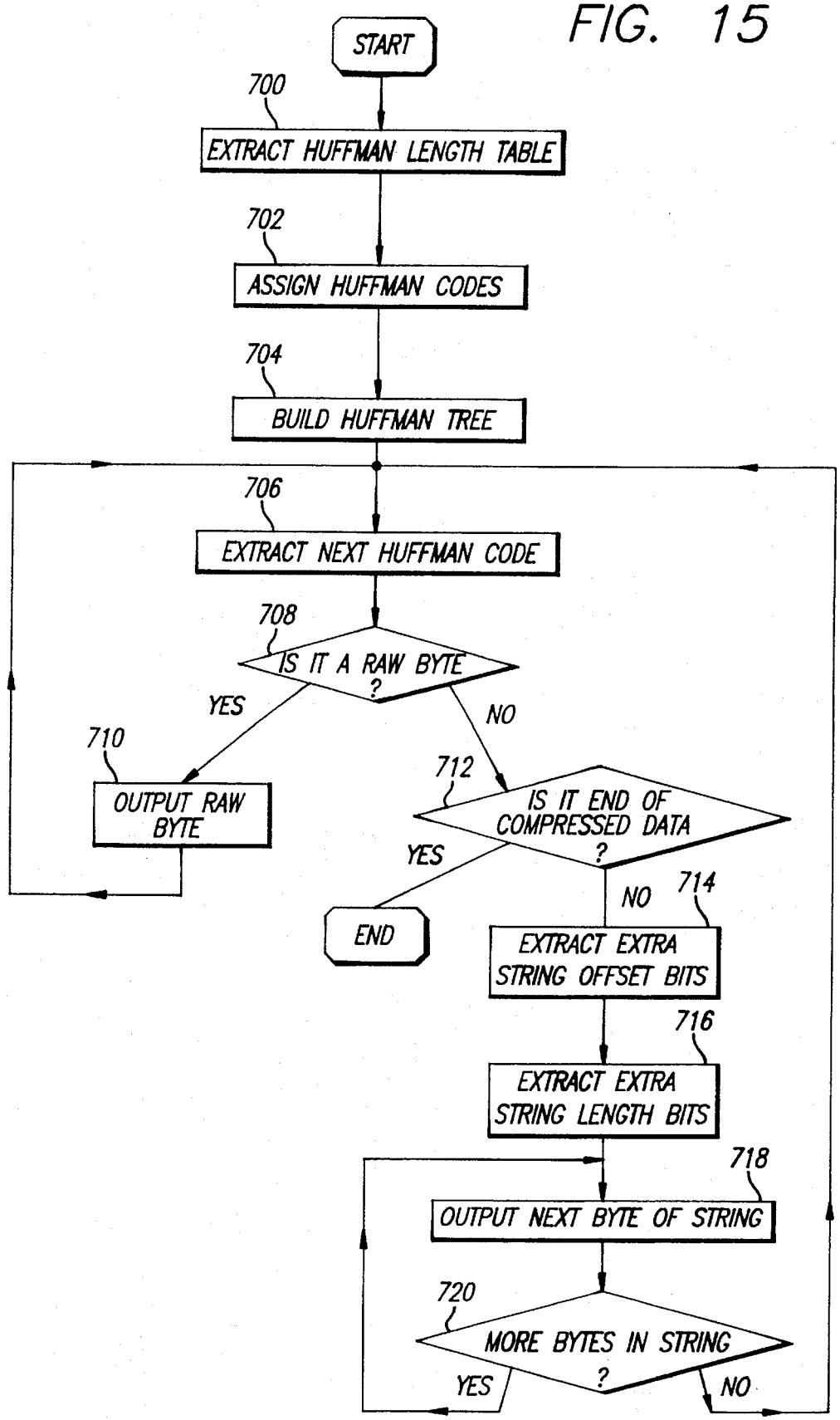
FIG. 15 is a flow block diagram of a decompression operation for decompressing data encoded in accordance with the present invention.

Referring now to FIG. 15, a flow block diagram of a decompression operation for decompressing data encoded in accordance with the present invention is depicted. The decompression operation is simpler than the compression operation, largely because no string search is required and because the data can be processed in a single pass, without an intermediate buffer.

The decompression operation begins at block 700, where the decompression unit 6 reads in the Huffman length table from the compressed input stream. Since these lengths are stored in compressed format, they are decompressed from the compressed input bit stream according to the method used by the compression unit 4. In the preferred embodiment, the run-length encoding of FIG. 13 is used, although many other techniques are possible. With the length of the code for each Huffman bin known, processing continues at block 702, where Huffman codes are assigned to each bin, using the algorithm shown in FIG. 12. Given the Huffman codes for the token bins, processing continues at block 704, where a Huffman tree is built to decode the tokens.

In the preferred embodiment, the Huffman tree is represented by a data structure in a memory, such as is depicted at 750 in FIG. 16. The tree is depicted graphically at 756. The corresponding Huffman codes are listed at 758. The contents of each memory cell of the data structure 750 consist of two fields, a tag bit field 752 and a child/bin field 754. A tag bit in the memory cell tells whether the cell contains a leaf of the tree, or whether there are children. If the tag bit indicates that there are children, the remaining bits of the cell give the memory address, N, of the left child, and the right child will be found at address N+1. If the tag bit indicates that this is a leaf of the Huffman tree, the remaining bits of the memory cell contain the Huffman bin number associated with that leaf. In the preferred embodiment, the memory width is at least 11 bits, allowing for a tag bit and 10 address bits. Note that, in the preferred embodiment, only 336*2 memory cells are actually required to include the entire tree, and this requires 10 bits of address.

To extract tokens from the compressed input data stream and decode them, one bit is read at a time. The starting memory address is set at M=0. If the bit is a zero, the contents of the left node (address M) are examined. If the bit is a one, the contents of the right node (address M+1) are examined. If the node of interest is not a leaf, M is set equal to N (the remaining bits of the memory cell), and the tree traversal continues in this fashion until a leaf node is encountered. When the node is a leaf, the Huffman bin number is extracted from the memory cell contents.

If the Huffman bin corresponds to a raw byte, the decompression unit 6 outputs the raw byte. If the Huffman bin corresponds to a string, any extra bits required to specify the string offset and length are extracted from the input data stream. The string is then output, one byte at a time. In the preferred embodiment, as in most sliding window decompression schemes, this is done by keeping a history array of the last MEMSIZE bytes output, and indexing back into the history array by the offset to pull out a byte. All bytes output, either raw bytes or string bytes, are added to the history array. If the Huffman bin corresponds to the end of compressed data mark, the decompression unit 6 stops. Otherwise, after processing each string or raw byte, the process of extracting tokens continues until the input stream is exhausted or until the end of compressed data mark is encountered.

In an alternative embodiment, the Huffman table is built as a multi-bit lookup table to allow faster operation. A fixed number (K) of bits is extracted from the input stream and used to lookup in the table, which has $2^K$ entries. The table size typically is 512 or 1024 entries, corresponding to K=9 or 10. Each table entry contains a code length (L), telling how many of the bits are actually needed. If this code length is K or less, it means that the bits extracted are sufficient to uniquely identify the Huffman bin, and the remainder of the table entry specifies the Huffman bin number. In this case, K-L bits that were extracted from the input data stream were actually not needed, so they were effectively "put back" into the input stream before proceeding with the Huffman bin processing. If K is greater than L, the remainder of the table entry specifies a memory location (N) for the rest of the Huffman subtree to be traversed, one bit at a time, exactly as described above for the preferred embodiment. In general, leaf entries in the table are replicated $2^{K-L}$) times. This technique allows most Huffman bins to be extracted using a single memory cycle instead of one memory cycle per bit of Huffman code length and can result in a substantial speedup of the decompression process.

Referring back to FIG. 15, once the Huffman tree has been built, processing continues at block 706 where the next Huffman code from the compressed input data stream is extracted and followed through the data structure for the Huffman codes to determine the bin represented by the code. Next, at block 708 a determination is made as to whether the Huffman bin is a raw byte. If it is a raw byte, processing continues at block 710, where the raw byte is output to the uncompressed data stream. Processing then returns to block 706.

If, at block 708, the determination was that the Huffman bin is not a raw byte, processing continues to block 712 where a determination is made as to whether the Huffman bin is an "End of Compressed Data" marker. If it is, processing ends and the decompression is complete. If it is not, processing continues to block 714, where extra string offset bits are extracted if required for the particular Huffman bin. Processing then continues to block 716, where extra string length bits are extracted if required for the particular Huffman bin.

Processing then continues to block 718, where the next byte of the matching string is output from the history array maintained by the decompression unit 6 at the indicated offset and length. Processing then continues to block 720, where a determination is made as to whether there are more bytes in the matching string to be output. If there are, processing returns to block 718 where the next byte is output. If there are no more bytes in the matching string, processing returns to block 706 where the next Huffman code is extracted.

The invention has been described in an exemplary and preferred embodiment, but is not limited thereto. Those skilled in the art will recognize that a number of additional modifications and improvements can be made to the invention without departure from the essential spirit and scope. The scope of the invention should only be limited by the appended set of claims.

We claim:

1. A data compression method comprising:

performing a search for matching strings in a window of input bytes, said search producing a stream of tokens, said tokens representing either a raw byte or a matching string of a certain length and a certain offset back into said window;

assigning said tokens to predefined bins, some of said bins containing matching strings of a predetermined length and within a certain offset range;

assigning variable length codes to each bin based on the frequency of occurrence of tokens assigned to each bin;

outputting for each token generated said variable length codes for said bin to which each token is assigned to the output data stream; and after each said variable length code is output, outputting extra bits, if required, to specify exactly said token within said bin.

2. The method of claim 1, further comprising:

completing said matching string search of all of the input data stream before assigning said variable length codes;

counting the occurrences of tokens in each bin from the entire input stream;

assigning said variable length codes based on said occurrence counts;

producing a coding table which indicates the variable length code assigned to each bin; and outputting said coding table to the output data stream before outputting any encoded tokens.

3. The method of claim 2, wherein said assigning said variable length codes further comprises assigning said variable length codes using Huffman's algorithm based on said occurrence counts.

4. The method of claim 3, wherein said producing a coding table further comprises producing a coding table containing only the lengths of said variable length codes.

5. The method of claim 4, further comprising:

compressing said coding table using a run-length compression scheme.

6. The method of claim 4, further comprising:

compressing said coding table using Huffman coding; and generating a preliminary table used to specify the Huffman codes assigned to the various lengths in said coding table.

7. The method of claim 1, further comprising:

assigning a special bin to indicate the end of compressed output data; and outputting the code for said end of compressed output data bin after all other tokens have been output.

8. The method of claim 1, further comprising assigning said bins as follows:

| Bin Number | Bin Description |
|---|---|
| 1–255 | Raw bytes 0-255 |
| 256–258 | String, length 3, 4, 5, offset 1 |
| 259–261 | String, length 3, 4, 5, offset 2 |
| 262–264 | String, length 3, 4, 5, offset 3 |
| 265–267 | String, length 3, 4, 5, offset 4–5 |
| 268–270 | String, length 3, 4, 5, offset 6–7 |
| 271–273 | String, length 3, 4, 5, offset 8–11 |
| 274–276 | String, length 3, 4, 5, offset 12–15 |
| 277–279 | String, length 3, 4, 5, offset 14–23 |
| 280–282 | String, length 3, 4, 5, offset 24–31 |
| 283–285 | String, length 3, 4, 5, offset 32–47 |
| 286–288 | String, length 3, 4, 5, offset 48–63 |
| 289–291 | String, length 3, 4, 5, offset 64–95 |
| 292–294 | String, length 3, 4, 5, offset 96–127 |
| 295–297 | String, length 3, 4, 5, offset 128–191 |
| 298–300 | String, length 3, 4, 5, offset 192–255 |
| 301–303 | String, length 3, 4, 5, offset 256–383 |
| 304–306 | String, length 3, 4, 5, offset 384–511 |
| 307–309 | String, length 3, 4, 5, offset 512–767 |
| 310–312 | String, length 3, 4, 5, offset 768–1023 |
| 313–315 | String, length 3, 4, 5, offset 1024–1535 |
| 316–318 | String, length 3, 4, 5, offset 1536–2047 |
| 319–333 | String, length 6–20 |
| 334 | String, length 21 and above |
| 335 | End of compressed data. |

9. The method of claim 8, further comprising:

following codes for bins 256–318 by a certain number of extra bits to specify the string offset, as follows:

| Category Number | Extra offset bits |
|---|---|
| 256–264 | 0 |
| 256–270 | 1 |
| 271–276 | 2 |
| 277–282 | 3 |
| 283–288 | 4 |
| 289–294 | 5 |
| 295–300 | 6 |
| 301–306 | 7 |
| 307–312 | 8 |
| 313–318 | 9. |

10. The method of claim 9, further comprising:

following codes for bins 319–334 by extra bits to specify the string offset, as follows:

| | |
|---|---|
| 00bbbbb | Offsets 1–32 |
| 01bbbbbbb | Offsets 33–160 |
| 10bbbbbbbbb | Offsets 161–672 |
| 11bbbbbbbbbbb | Offsets 673–2047. |

11. The method of claim 10, further comprising:

following the code and offset bits for bin 334 by extra bits to specify the string length, as follows:

| String Length | Extra Length Bits |
|---|---|
| 21 | 0000 |
| 22 | 0001 |
| 23 | 0010 |
| 24 | 0011 |
| 25 | 0100 |
| . | . |
| . | . |
| . | . |
| 35 | 1110 |
| 36 | 1111 00000000 |
| 37 | 1111 00000001 |
| 38 | 1111 00000010 |
| . | . |
| . | . |
| 290 | 1111 11111110 |
| 291 | 1111 11111111 000000000000 |
| 292 | 1111 11111111 000000000001 |
| 293 | 1111 11111111 000000000010 |
| . | . |
| . | . |
| 4387 | 1111 11111111 111111111110 |
| 4388 | 1111 11111111 111111111111 0000000000000000 |
| 4389 | 1111 11111111 111111111111 0000000000000001 |
| . | . |
| . | . |
| 69922 | 1111 11111111 111111111111 1111111111111110 |
| 69923 | 1111 11111111 111111111111 1111111111111110 0000000000000000 |
| 69924 | 1111 11111111 111111111111 1111111111111110 0000000000000001. |

12. A data decompression method which decompresses a compressed input data stream, comprising:

maintaining a history array of all bytes output; and repeating the following steps until the input data stream is exhausted or until a code indicating the end of said compressed input data stream is encountered:

extracting a bin code from said compressed input data stream;

extracting any extra bits required to determine exactly the token associated with said bin code;

operative when said token corresponds to a raw byte, outputting said raw byte; and operative when said token corresponds to a matching string, outputting all bytes of said string by indexing back into said history array using the offset of said string.

13. The method of claim 12, further comprising:

extracting a coding table from the beginning of said compressed input data stream; and extracting said variable length codes for said categories from said coding table.

14. A data compression apparatus comprising:

means for performing a search for matching strings in a window of input bytes, said search producing a stream of tokens, said tokens representing either a raw byte or a matching string of a certain length and a certain offset back into said window;

means for assigning said tokens to predefined bins, some of said bins containing matching strings of a predetermined length and within a certain offset range;

means for assigning variable length codes to each bin based on the frequency of occurrence of tokens assigned to each bin;

means for outputting for each token generated said variable length codes for said bin to which each token is assigned to the output data stream; and means for outputting extra bits, if required, to specify exactly said token within said bin.

15. The apparatus of claim 14, further comprising:

means for completing said matching string search of all of the input data stream before assigning said variable length codes;

means for counting the occurrences of tokens in each bin from the entire input stream;

means for assigning said variable length codes based on said occurrence counts;

means for producing a coding table which indicates the variable length code assigned to each bin; and means for outputting said coding table to the output data stream before outputting any encoded tokens.

16. The apparatus of claim 15, wherein said means for assigning said variable length codes further comprises means for assigning said variable length codes using Huffman's algorithm based on said occurrence counts.

17. The apparatus of claim 16, wherein said means for producing a coding table further comprises means for producing a coding table containing only the lengths of said variable length codes.

18. The apparatus of claim 17, further comprising:

means for compressing said coding table using a run-length compression scheme.

19. The apparatus of claim 17, further comprising:

means for compressing said coding table using Huffman coding; and means for generating a preliminary table used to specify the Huffman codes assigned to the various lengths in said coding table.

20. The apparatus of claim 14, further comprising:

means for assigning a special bin to indicate the end of compressed output data; and means for outputting the code for said end of compressed output data bin after all other tokens have been output.

21. The apparatus of claim 14, further comprising means for assigning said bins as follows:

| Bin Number | Bin Description |
|---|---|
| 0–255 | Raw bytes 0–255 |
| 256–258 | String, length 3, 4, 5, offset 1 |
| 259–261 | String, length 3, 4, 5, offset 2 |
| 262–264 | String, length 3, 4, 5, offset 3 |
| 265–267 | String, length 3, 4, 5, offset 4–5 |
| 268–270 | String, length 3, 4, 5, offset 6–7 |
| 271–273 | String, length 3, 4, 5, offset 8–11 |
| 274–276 | String, length 3, 4, 5, offset 12–15 |
| 277–279 | String, length 3, 4, 5, offset 16–23 |
| 280–282 | String, length 3, 4, 5, offset 24–31 |
| 283–285 | String, length 3, 4, 5, offset 32–47 |
| 286–288 | String, length 3, 4, 5, offset 48–63 |
| 289–291 | String, length 3, 4, 5, offset 64–95 |
| 292–294 | String, length 3, 4, 5, offset 96–127 |
| 295–297 | String, length 3, 4, 5, offset 128–191 |
| 298–300 | String, length 3, 4, 5, offset 192–255 |
| 301–303 | String, length 3, 4, 5, offset 256–383 |
| 304–306 | String, length 3, 4, 5, offset 384–511 |
| 307–309 | String, length 3, 4, 5, offset 512–767 |
| 310–312 | String, length 3, 4, 5, offset 768–1023 |
| 313–315 | String, length 3, 4, 5, offset 1024–1535 |
| 316–318 | String, length 3, 4, 5, offset 1536–2047 |
| 319–333 | String, length 6–20 |

-continued

| Bin Number | Bin Description |
|---|---|
| 334 | String, length 21 and above |
| 335 | End of compressed data. |

22. The apparatus of claim 21, further comprising:

means for following codes for bins 256–318 by a certain number of extra bits to specify the string offset, as follows:

| Category Number | Extra offset bits |
|---|---|
| 256–264 | 0 |
| 256–270 | 1 |
| 271–276 | 2 |
| 277–282 | 3 |
| 283–288 | 4 |
| 289–294 | 5 |
| 295–300 | 6 |
| 301–306 | 7 |
| 307–312 | 8 |
| 313–318 | 9. |

23. The apparatus of claim 22, further comprising:

means for following codes for bins 319–334 by extra bits to specify the string offset, as follows:

| | |
|---|---|
| 00bbbbb | Offsets 1–32 |
| 01bbbbbbb | Offsets 33–160 |
| 10bbbbbbbbb | Offsets 161–672 |
| 11bbbbbbbbbbb | Offsets 673–2047. |

24. The apparatus of claim 23, further comprising:

means for following the code and offset bits for bin 334 by extra bits to specify the string length, as follows:

| String Length | Extra Length Bits |
|---|---|
| 21 | 0000 |
| 22 | 0001 |
| 23 | 0010 |
| 24 | 0011 |
| 25 | 0100 |
| . | . |
| . | . |
| 35 | 1110 |
| 36 | 111 00000000 |
| 37 | 1111 00000001 |
| 38 | 1111 00000010 |
| . | . |
| . | . |
| 290 | 1111 11111110 |
| 291 | 1111 11111111 000000000000 |
| 292 | 1111 11111111 000000000001 |
| 293 | 1111 11111111 000000000010 |
| . | . |
| . | . |
| 4387 | 1111 11111111 111111111110 |
| 4388 | 1111 11111111 111111111111 0000000000000000 |
| 4389 | 1111 11111111 111111111111 0000000000000001 |
| 69922 | 1111 11111111 111111111111 1111111111111110 |
| 69923 | 1111 11111111 111111111111 1111111111111110 0000000000000000 |
| 69924 | 1111 11111111 111111111111 1111111111111110 0000000000000001. |

25. A data decompression method which decompresses a compressed input data stream, comprising:

means for maintaining a history array of all bytes output; and means for extracting a bin code from said compressed input data stream;

means for extracting any extra bits required to determine exactly the token associated with said bin code;

means for outputting a raw byte; and means for outputting all bytes of a matching string by indexing back into said history array using the offset of said string.

26. The apparatus of claim 25, further comprising:

means for extracting a coding table from the beginning of said compressed input data stream; and means for extracting said variable length codes for said categories from said coding table.

\* \* \* \* \*